United States Patent
Hung et al.

(10) Patent No.: US 7,515,458 B2
(45) Date of Patent: Apr. 7, 2009

(54) STRUCTURE AND ACCESS METHOD FOR MAGNETIC MEMORY CELL AND CIRCUIT OF MAGNETIC MEMORY

(75) Inventors: Chien-Chung Hung, Taipei (TW); Yung-Hsiang Chen, Hsinchu County (TW); Ming-Jer Kao, Tainan (TW); Yuan-Jen Lee, Taipei County (TW); Yung-Hung Wang, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 168 days.

(21) Appl. No.: 11/465,460

(22) Filed: Aug. 18, 2006

(65) Prior Publication Data

US 2007/0242501 A1   Oct. 18, 2007

(30) Foreign Application Priority Data

Apr. 18, 2006   (TW) .............................. 95113731 A

(51) Int. Cl.
   *G11C 11/00*   (2006.01)
(52) U.S. Cl. ..................................................... 365/158
(58) Field of Classification Search ................. 365/158
   See application file for complete search history.

(56) References Cited

U.S. PATENT DOCUMENTS

| 6,545,906 B1 | 4/2003 | Savtchenko et al. |
| 6,633,498 B1 | 10/2003 | Engel et al. |
| 2004/0037112 A1* | 2/2004 | Ooishi ................... 365/185.09 |
| 2006/0113619 A1 | 6/2006 | Hung et al. |

* cited by examiner

*Primary Examiner*—Hoai V Ho
*Assistant Examiner*—Kretelia Graham
(74) *Attorney, Agent, or Firm*—Jianq Chyun IP Office

(57) ABSTRACT

A magnetic memory cell, used in a magnetic memory device, includes a stacked magnetic pinned layer, serving as a part of the base structure. The stacked magnetic pinned stacked layer has a top pinned layer and a bottom pinned layer, between which there is a sufficient large magnetic coupling force to maintain magnetization of the top pinned layer on a reference direction. A tunnel barrier layer is disposed on the stacked magnetic pinned layer. A magnetic free stacked layer is disposed on the tunnel barrier layer. The magnetic free stacked layer includes a bottom free layer having a bottom magnetization and a top free layer having a top magnetization. When no assisted magnetic field is applied, the bottom magnetization is anti-parallel to the top magnetization and is perpendicular to the reference direction on the top pinned layer. A magnetic bias layer can be also disposed on the top free layer.

28 Claims, 16 Drawing Sheets

"1"                  "0"

STRUCTURE AND ACCESS METHOD FOR MAGNETIC MEMORY CELL AND CIRCUIT OF MAGNETIC MEMORY

CROSS-REFERENCE TO RELATED APPLICATION

This application claims the priority benefit of Taiwan application serial no. 95113731, filed on Apr. 18, 2006. All disclosure of the Taiwan application is incorporated herein by reference.

BACKGROUND OF THE INVENTION

1. Field of the Invention

The present invention relates to technology of a magnetic memory. More particularly, the present invention relates to the structure and access method for a magnetic memory cell and the circuit of a magnetic memory, wherein it at least has the properties of low writing current and using an adjacent memory cell as a reference memory cell.

2. Description of Related Art

Magnetic memory, for example, magnetic random access memory (MRAM), is also a non-volatile memory, which has such advantages as non-volatility, high density, high read/write rate, anti-radiation etc. Magnetic memory records data of logic "0" or logic "1" through the magnetoresistance produced by parallel or anti-parallel arrangement of the magnetic moments of the magnetic material adjacent to the tunnel barrier layer. Generally when data is written, a magnetic memory cell is selected by two current lines, for example, bit lines (BL) and write words line (WWL), by the intersection of the induction magnetic fields of the BL and the WWL, and the magnetoresistance of the selected memory cell is changed by changing the direction of the magnetization vector of the free layer. When the data is to be read, current flows through the selected magnetic memory cell so that the digital value of the stored data can be determined from the magnetoresistance being read.

FIG. 1 illustrates the basic structure of a magnetic memory cell. Referring to FIG. 1, cross current lines 100 and 102 with suitable current passing through are required to write a magnetic memory cell. The current lines 100 and 102 are also referred as, for example, bit line and word line based on the operation. When currents pass through the two conductive lines, magnetic fields of two directions will be produced to obtain the required magnetic fields to be supplied to the memory cell 104. The magnetic memory cell 104 is of stacked layer structure and includes a magnetic pinned layer which has a fixed magnetization vector or a total magnetic moment in a predetermined direction. Different magnetoresistances are produced for reading data by using the angle differences between the magnetization vectors of the magnetic free layer and the magnetic pinned layer. Besides, if the data is to be written, a writing magnetic field is to be supplied to switch the direction of the magnetization vector of the magnetic free layer. The data stored in the memory cell can be read through the output electrodes 106 and 108. The operation detail of the magnetic memory is well-known by those skilled in the art and therefore will not be described herein.

FIG. 2 illustrates the recording mechanism of a magnetic memory. Referring to FIG. 2, the magnetic pinned layer 104a has a fixed magnetic moment direction 107. The magnetic free layer 104c is disposed on the magnetic pinned layer 104a and between the layers there is a tunnel barrier layer 104b. The magnetic free layer 104c has a magnetic moment direction 108a or 108b. Since the magnetic moment direction 108a is parallel to the magnetic moment direction 107, the magnetoresistance being produced represents, for example, data of "0". Contrarily, the magnetic moment direction 108b is anti-parallel to the magnetic moment direction 107, and the magnetoresistance being produced represents, for example, data of "1".

The relationship between the resistance (R) and the applied magnetic field (H) of a magnetic memory cell is as illustrated in FIG. 3. The solid line represents the magnetic field curve corresponding to the magnetoresistance of a single magnetic memory cell. However, the magnetic memory device includes a plurality of memory cells, and the condition of each memory cell is different, thus, the magnetoresistance curve may have variations as shown by the dashed line, which may result in writing error. FIG. 4 illustrates the array structure of conventional memory cells. The left diagram in FIG. 4 illustrates an array structure, for example, for writing into the memory cell 140 through supplying magnetic fields Hx and Hy in two directions. The right diagram in FIG. 4 illustrates the action of the magnetic fields Hx and Hy to the memory cell 140. In the solid line area, the memory status of the memory cell 140 is not changed since the magnetic fields are small. While the magnetic fields in a limited area outside the solid line area are suitable for reversing the magnetic fields. Large magnetic fields are not suitable because the adjacent memory cells will be disturbed magnetically if the magnetic fields are too large. Thus, the magnetic fields in the operation area 144 are serving as operation window. However, since the other memory cell 142 will also experience the partial supplied magnetic fields, the partial supplied magnetic fields may also disturb the data stored in the other memory cell 142 because the operating conditions around the memory cell 142 are different. Thus, writing error may be caused to the single-layer magnetic free layer 104c in FIG. 2.

To resolve the foregoing problems, some improved technologies have been provided. FIG. 5 illustrates another design of a conventional magnetic memory cell. In FIG. 5, a stacked magnetic pinned layer is formed by stacking a pinned layer 160, a magnetic coupling spacer 162, and a reference layer 164. The pinned layer 160 has a magnetization vector 172 and the reference layer 164 has a magnetization vector 174, and the directions of the magnetization vectors are as shown in FIG. 5, which are perpendicular to the surface of the figure. In addition, the single-layer free layer 168 is disposed on the reference layer 164 and is spaced by a tunnel barrier layer 166. The direction of the magnetization vector 176 of the magnetic free layer 168 is as shown in FIG. 5, which may be leftward or rightward and is perpendicular to the magnetization vector 174. There is an electrode layer 170 on the magnetic free layer 168, and besides, there are an anti-ferromagnetic layer, a buffer layer, and another electrode layer (not shown) under the pinned layer.

The design of the magnetic memory cell in FIG. 5 is to make the coupling between the magnetization vectors 172 and 174 very weak, and the magnetization vector 174 can be changed by the externally supplied assisted field. When the magnetization vector 174 is rotated for certain angle by the assisted field, the direction of the magnetization vector 176 can be determined by the angle difference between the magnetization vectors 176 and 174, accordingly the binary data thereof can be determined.

FIG. 6 illustrates the magnetic memory circuit formed by the magnetic memory cell in FIG. 5. In FIG. 6, the magnetic memory cells are arranged in an array and are controlled by bit lines BLi, BLj and write word lines WWLi, WWLj. For example, when the data stored in the memory cell 180 is to be read, the magnetization vector 188 of the reference layer is rotated for certain angle, here the magnetization vector 186 of the free layer is in rightward direction, thus a lower magnetoresistance is produced. Here the adjacent memory cell 182 is used as the reference memory cell and a reference magnetoresistance is directly read. Since the reference magnetoresistance is in an intermediate state and the magnetization vectors 186 and 184 are perpendicular to each other. The data stored in the memory cell 180 can be determined after the magnetoresistances being compared by a sense amplifier (SA).

According to the conventional technologies as shown in FIG. 5 and FIG. 6, the magnetization vector of the magnetic reference layer is rotated by the assisted field. However, the magnetization vector of the free layer could be disturbed at the same time, as shown in FIG. 7. The magnetization vector 186' of the free layer has departed from a magnetic easy axis of the free layer, and the magnetic field being supplied may cause change of status of the memory data. Thus, the conventional technologies described above may cause data errors.

Moreover, in U.S. Pat. No. 6,545,906, the single free layer is changed into a three layers structure and the magnetization vector of the free layer is rotated in toggle mode. However, since the data is stored by the direction magnetization vector of the free layer being parallel or anti-parallel to the direction of the magnetization vector of the pinned layer, the complex procedure of read before write is required and a set of reference cells is shared by a plurality of memory cells. The read before write process may cause at least slow operation rate, and the common reference bits may result in the reference memory cell being overloaded, which may affect the operation rate and also damages to the reference memory cell.

Accordingly, the manufacturers or designers are still devoting themselves to the searching of more satisfying magnetic memory cell and the design of driving method.

SUMMARY OF THE INVENTION

Accordingly, the present invention is directed to provide a magnetic memory cell structure, which has at least low writing current and simple operation procedure so as to increase operating rate.

The present invention provides a data access method, which can reverse the direction of the magnetization vector in a magnetic free layer effectively, and can further reduce data writing errors through negative current pulses.

The present invention provides a magnetic memory circuit, which may use the foregoing structure and data access method of a magnetic memory cell or may also use a memory cell different from the selected memory cell as reference memory cell for reducing or distracting the load of the reference memory cell.

The present invention provides a magnetic memory circuit employing, for example, conventional memory cells or memory cells of the present invention. However, the magnetization vector for operating the reference memory cell is arranged for replacing the magnetization vector being directly operated in the selected memory cell, and further the load of the reference memory cell can be reduced or distracted.

The present invention provides a magnetic memory cell structure which is suitable for a magnetic memory device. The magnetic memory cell includes a stacked magnetic pinned layer, serving as a part of a base structure, wherein the stacked magnetic pinned layer includes a top pinned layer and a bottom pinned layer and between which there is a sufficient large magnetic coupling force for maintaining a magnetization vector of the top pinned layer in a reference direction. A tunnel barrier layer is disposed on the stacked magnetic pinned layer. A magnetic free stacked layer is disposed on the tunnel barrier layer. Wherein the magnetic free stacked layer includes a bottom free layer having a bottom magnetization vector and a top free layer having a top magnetization vector. When no assisted magnetic field is supplied, the bottom magnetization vector of the bottom free layer is anti-parallel to the top magnetization vector of the top free layer and is perpendicular to the reference direction of the top pinned layer.

According to an embodiment of the present invention, the foregoing magnetic memory cell structure further includes a magnetic bias layer disposed on the magnetic free stacked layer. The magnetic bias layer produces a biased magnetic field to the magnetic free stacked layer for shifting a writing operation area to a magnetic field zero. The biased magnetic field is parallel or anti-parallel to the top magnetization vector of the top free layer.

According to an embodiment of the present invention, in the foregoing magnetic memory cell structure, the magnetic bias layer is a magnetic single layer or a magnetic stacked layer. The magnetic stacked layer is formed by stacking a non-magnetic metal layer, at least one ferromagnetic metal layer, and an anti-ferromagnetic metal layer.

According to an embodiment of the present invention, in the foregoing magnetic memory cell structure, the material of the top free layer and the bottom free layer of the magnetic free stacked layer is ferromagnetic material, and the top free layer and the bottom free layer are separated by a magnetic coupling spacer.

The present invention further provides a data access method suitable for a magnetic memory cell of a magnetic memory device, and the data access method includes a data access reading method and a data access writing method. The magnetic memory device includes the foregoing magnetic memory cell structure, a word current line, and a bit current line. Wherein the direction of an easy axis of the magnetic free stacked layer is considered as 0°. For example, a positive current passing through the word current line produces substantially a magnetic field in the direction of +45°, and a positive current passing through the bit current line produces substantially a magnetic field in the direction of −45°. The data access reading method includes a first reading stage, a second reading stage, and a third reading stage. The first reading stage includes supplying a first assisted magnetic field to the magnetic memory cell in a first direction, the first assisted magnetic field is preferably in the first direction which is substantially in, for example, 45°, 135°, 225°, or 315° to the easy axis.

A second assisted magnetic field is supplied to the magnetic memory cell in a second direction, wherein a second direction of the second assisted magnetic field is substantially in 90° to the first direction so that a total magnetic field direction is substantially on the easy axis. Wherein the action of the first direction and the second direction may change the direction of the bottom magnetization vector of the magnetic free stacked layer to be parallel or anti-parallel to the direction of the magnetization vector of the top pinned layer. Moreover, the difference of magnetoresistance caused by the difference between the angles of the magnetization vectors of the bottom free layer of the magnetic free stacked layer and the stacked magnetic pinned layer is read. A binary data stored presently can be obtained by comparing the magnetoresistance and a reference magnetoresistance. Furthermore, the second reading stage includes turning off the second assisted magnetic field. The third reading stage includes turning off the first assisted magnetic field.

According to an embodiment of the present invention, during, the first reading stage of the foregoing data access reading method, a predetermined negative direction magnetic field which is in opposite direction to the second assisted magnetic field is further supplied before supplying the second assisted magnetic field and during the period before supplying the first assisted magnetic field.

According to an embodiment of the present invention, during the second and third reading stages of the foregoing data access reading method, another successive negative direction magnetic field, which is in opposite direction to the second assisted magnetic field, is further supplied after turning off the second assisted magnetic field and during the period after turning off the first assisted magnetic field.

According to an embodiment of the present invention, the foregoing data access writing method further includes a first writing stage, a second writing stage, and a third writing stage.

During the first writing stage, the same steps are executed as during the first reading stage. If the pre-read binary data is the same as a data to be written, the process is finished after executing the second and the third reading stages, otherwise the following stages are entered. During the second writing stage, if the binary data is different from a data to be written, the first assisted magnetic field is turned off first. During the third writing stage, the second assisted magnetic field is turned off.

According to an embodiment of the present invention, during the first writing stage in the foregoing data access writing method, a predetermined negative direction magnetic field, which is in opposite direction to the second assisted magnetic field, is further supplied before supplying the second assisted magnetic field and during the period before supplying the first assisted magnetic field.

According to an embodiment of the present invention, during the second and the third writing stages in the foregoing data access writing method, another successive negative direction magnetic field, which is in opposite direction to the first assisted magnetic field, is further supplied after turning off the first assisted magnetic field and during the period after turning off the second assisted magnetic field.

According to an embodiment of the present invention, after the third writing stage in the foregoing data access writing method, the magnetization vector of the magnetic free stacked layer is rotated 180°.

The present invention further provides a magnetic memory circuit which performs data access in binary data mode. The magnetic memory circuit includes a plurality of foregoing magnetic memory cell structures formed into a 2-dimensional array having a plurality of memory columns and a plurality of memory rows. A plurality of bit current lines are respectively disposed corresponding to the memory columns. A plurality of word current lines are respectively disposed corresponding to the memory rows. Each of a plurality of read bit lines reads the magnetoresistance of each of the memory cell structures. A driving circuit unit is used for controlling the word current lines, the bit current lines, and the read bit lines, so as to supply a plurality of assisted magnetic fields required for data access to the selected memory cell structure, and to read a magnetoresistance. Wherein, one of the memory cell structures, which are not supplied with magnetic field, is used as a reference memory cell and a reference magnetoresistance of the reference memory cell is read. A comparison circuit unit receives and compares the magnetoresistance and the reference magnetoresistance to determine a binary data stored in the selected memory cell structure.

According to an embodiment of the present invention, in the foregoing magnetic memory circuit, a reference memory cell row is further disposed at one side of the memory rows so that the outmost memory row can be compared with the reference memory row.

The present invention further provides another magnetic memory circuit which can perform data access in a binary data mode. The magnetic memory circuit includes a plurality of memory cell structures formed into a 2-Dimensional array having a plurality of memory columns and a plurality of memory rows. A plurality of bit current lines are disposed respectively corresponding to the memory columns. A plurality of word current lines are disposed respectively corresponding to the memory rows. Each of a plurality of read bit lines can read a magnetoresistance of each of the memory cell structures. A driving circuit unit controls the word current lines, the bit current lines, and the read bit lines so as to directly read a magnetoresistance of the selected memory cell structure, to supply a plurality of assisted magnetic fields required for access on a reference memory cell structure different from the selected memory cell structure, and to read a reference magnetoresistance. A comparison circuit unit receives and compares the magnetoresistance and the reference magnetoresistance so as to determine a binary data stored in the selected memory cell structure.

According to an embodiment of the present invention, during a writing operation of the foregoing magnetic memory circuit, the binary data is kept if the binary data read by the comparison circuit unit is the same as a data to be written, and the direction of a magnetization vector of a magnetic free stacked layer of the selected memory cell structure is reversed by the driving circuit unit if the binary data is different from the data to be written.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

The present invention provides a magnetic memory cell structure which allows at least lower writing current to increase the operation yield. Besides, the present invention also provides a data access method. Based on the magnetic memory cell structure and the data access method, the present invention can effectively reverse the direction of the magnetization vector of the magnetic free layer, and further more can reduce data writing errors through negative current pulse. Moreover, the present invention also provides a magnetic memory circuit which employs the aforementioned magnetic memory cell structure and data access method and can distract the load of a reference memory cell. The present invention will be described with reference to some embodiments in following, however, the present invention is not limited to these embodiments.

Figure 1:
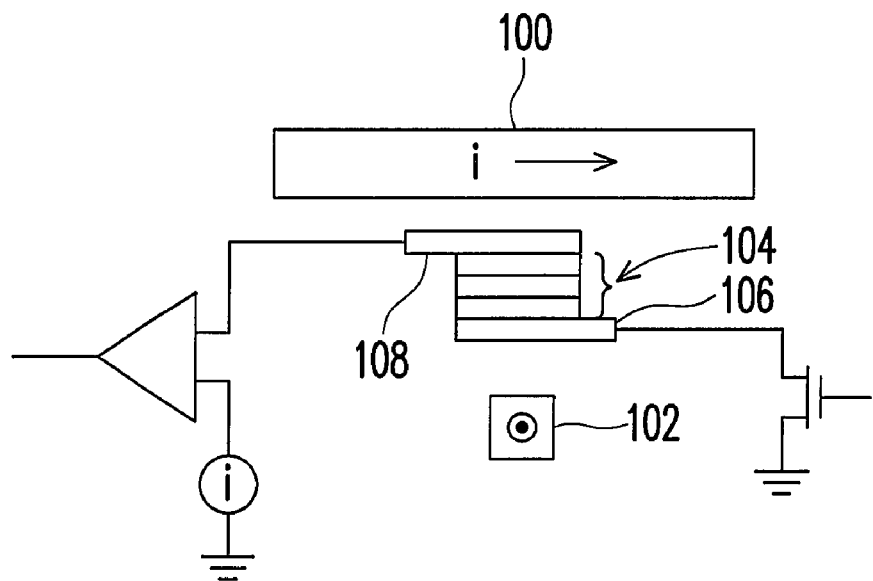
FIG. 1 schematically illustrates the basic structure of a magnetic memory cell.
Figure 2:
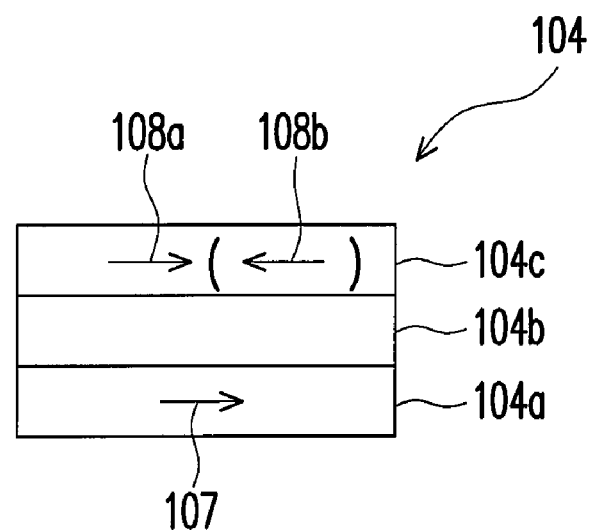
FIG. 2 schematically illustrates the recording mechanism of a magnetic memory.
Figure 3:
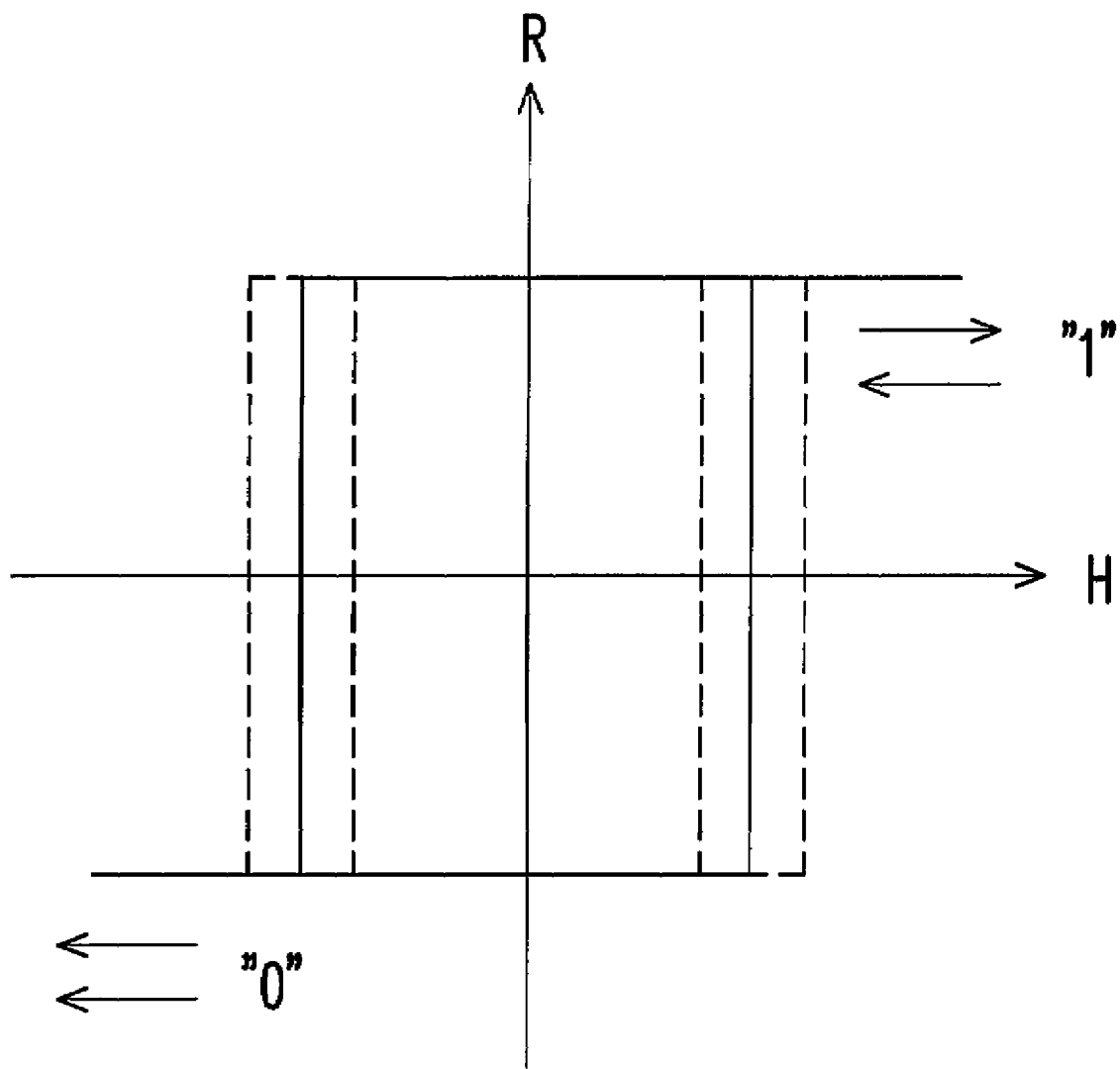
FIG. 3 schematically illustrates the relationship between the quantities of the magnetoresistance (R) and the magnetic field (H) of a magnetic memory cell.
Figure 4:
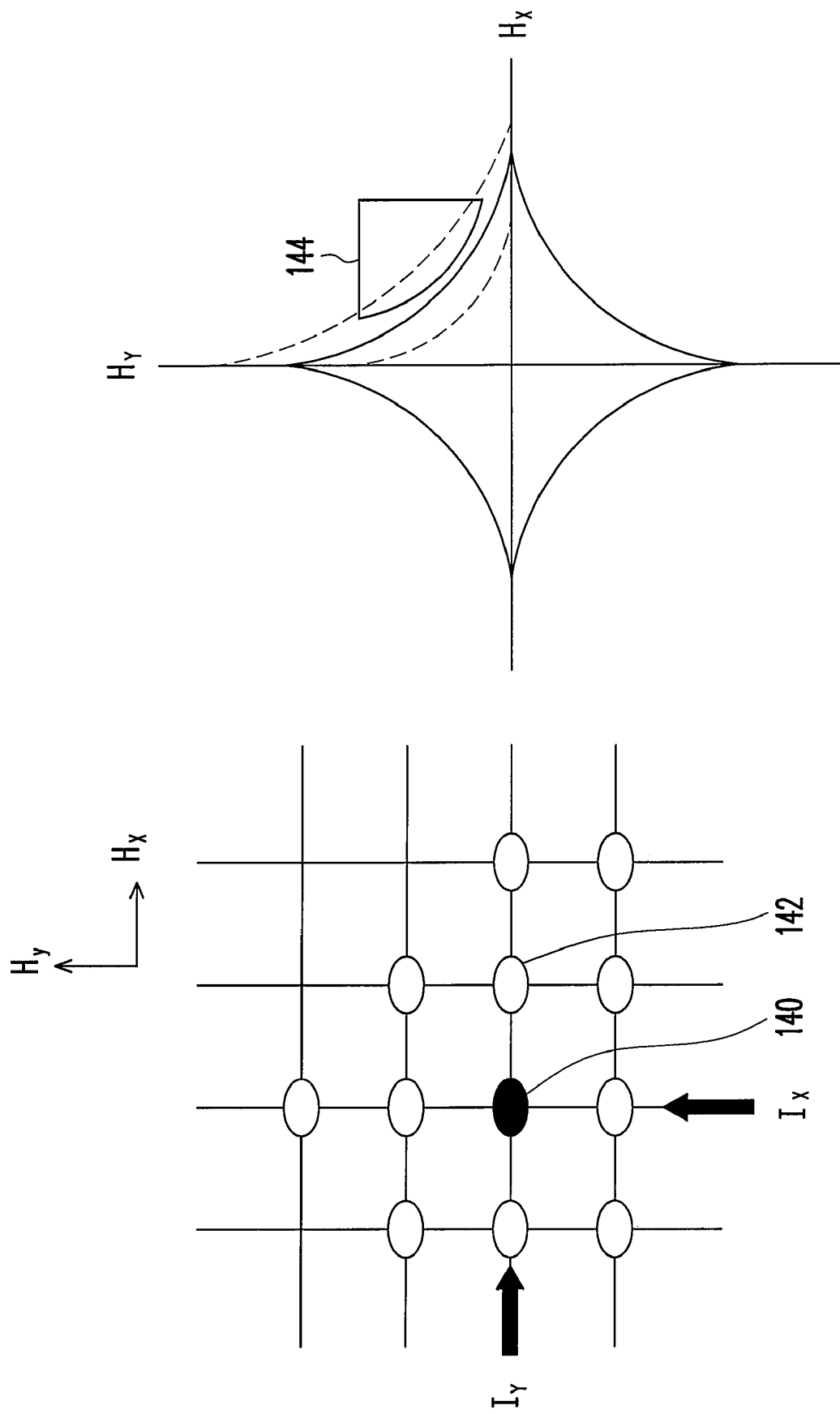
FIG. 4 schematically illustrates the array structure of a conventional memory cell.
Figure 5:
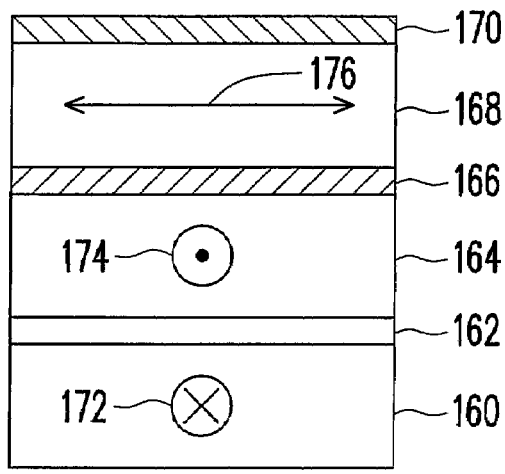
FIG. 5 schematically illustrates another design of a conventional magnetic memory cell.
Figure 6:
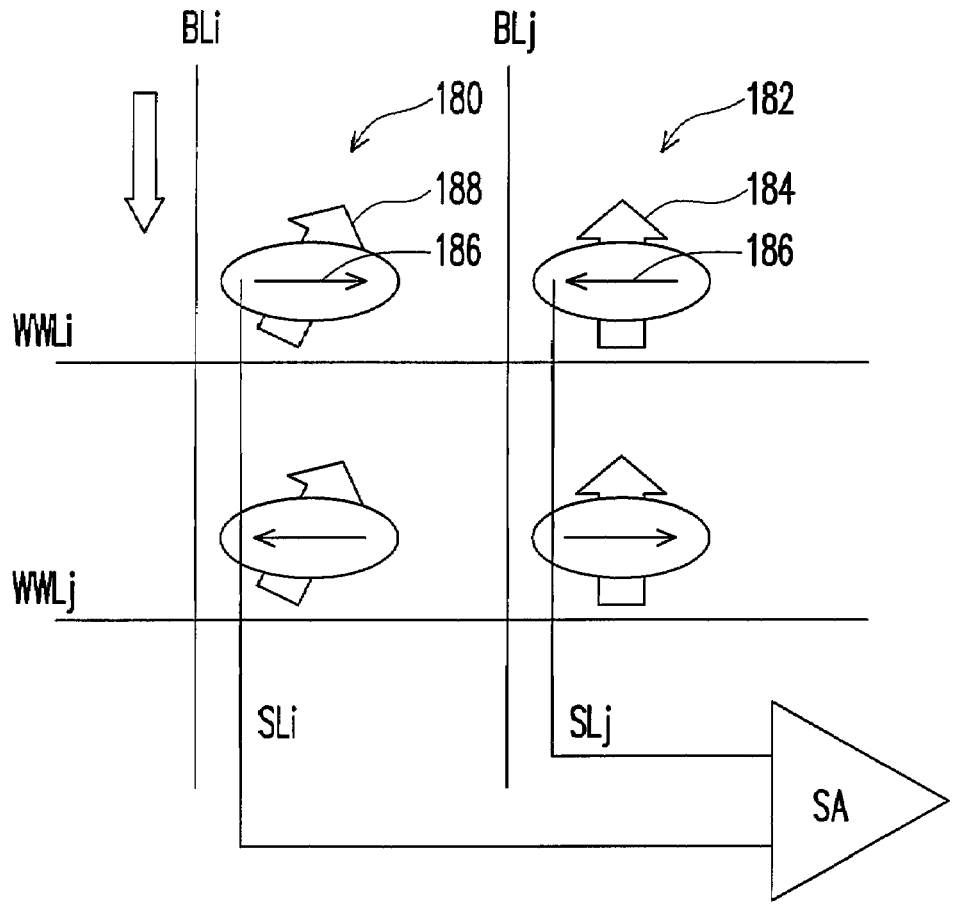
FIG. 6 schematically illustrates the magnetic memory circuit formed by the magnetic memory cell in FIG. 5.
Figure 7:
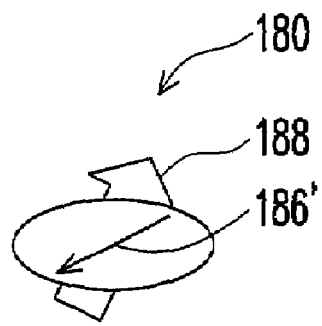
FIG. 7 schematically illustrates that the magnetic field supplied to a magnetic pinned layer will disturb the magnetization vector of the free layer by rotating the magnetization vector of the magnetic pinned layer.
Figure 8:
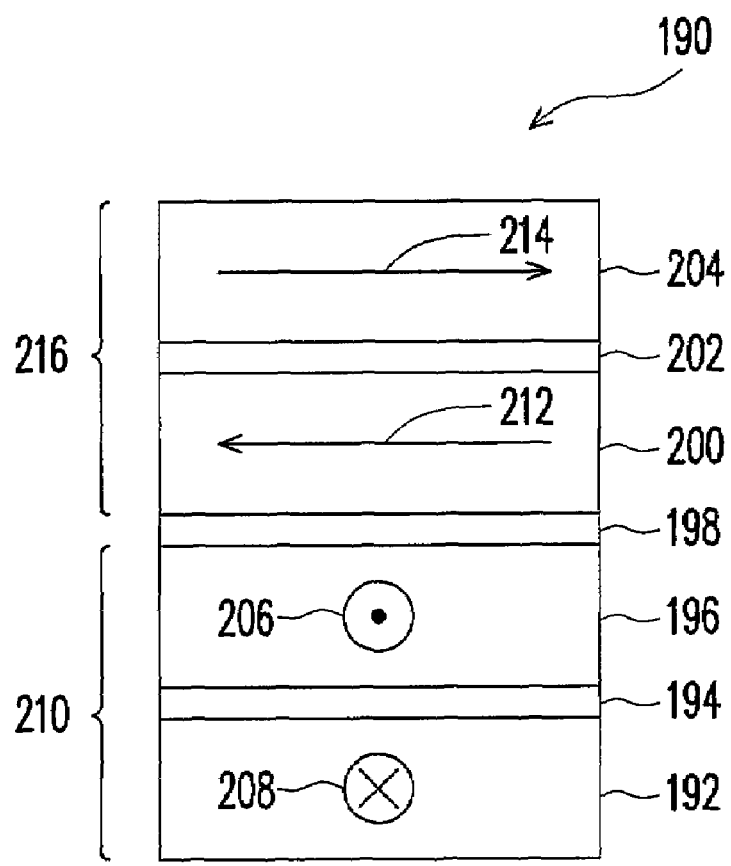
FIG. 8 schematically is a cross-sectional view illustrating the structure of a magnetic memory cell according to an embodiment of the present invention.

FIG. 8 is a cross-sectional view schematically illustrating the structure of a magnetic memory cell according to an embodiment of the present invention. Referring to FIG. 8, only a part of the magnetic memory cell structure 190 which is related to the present invention is illustrated to be referred to the structure in FIG. 1. Only a stacked magnetic pinned layer 210 is illustrated as to a base structure of the magnetic memory cell structure 190. The stacked magnetic pinned layer 210 includes a bottom pinned layer 192 having a magnetization vector 208 and a top pinned layer 196 having a magnetization vector 206. The bottom pinned layer 192 and the top pinned layer 196 are separated by a magnetic coupling spacer 194. The magnetic coupling strength of the magnetization vectors 208 and 206 of the bottom pinned layer 192 and the top pinned layer 196 is sufficient large so that the directions of the magnetization vectors will not be changed by external magnetic field. The manufacturing process and the material of the magnetic memory cell structure 190 should be understood by those skilled in the art and therefore will not be described herein.

Moreover, a magnetic free stacked layer 216 is disposed on the stacked magnetic pinned layer 210 and the magnetic free stacked layer 216 and the stacked magnetic pinned layer 210 are spaced by a tunnel barrier layer 198. The magnetic free stacked layer 216 includes a magnetic bottom free layer 200 and a magnetic top free layer 204. The bottom free layer 200 and the top free layer 204 have magnetization vector 212 and magnetization vector 214 respectively and are spaced by the magnetic coupling spacer 202. The magnetization vector 212 is anti-parallel to the magnetization vector 214 and is substantially perpendicular to magnetization vectors 206 and 208 of the stacked magnetic pinned layer 210. Here the direction of a magnetization vector of the stacked magnetic free layer is along the direction of an easy axis of the magnetic material in general status and without external magnetic field. In other words, in the natural status without external magnetic field, the magnetization direction of the stacked magnetic pinned layer 210 is perpendicular to the magnetization direction of the magnetic free stacked layer 216. Thus, the magnetoresistances of the magnetization vector 212 and the magnetization vector 206 are in intermediate state, namely, between the magnetoresistances of parallel state and anti-parallel state, and can be used as a reference magnetoresistance state.

The reading operation to the magnetic free stacked layer 216 depends on, for example, whether the direction of the magnetization vector 212 is leftward or rightward. An appropriate auxiliary magnetic field is supplied when reading data to horizontally rotate the magnetization vector 212 of the magnetic free stacked layer 216, for example, 90°. To be viewed vertically (not shown), the magnetization vector 212 is parallel to the magnetization vector 206 if the magnetization vector 212 is rotated 90° counterclockwise. However, if the magnetization vector 212 is originally rightward, the magnetization vector 212 will be anti-parallel to the magnetization vector 206 after being rotated 90° counterclockwise. Thus, the data stored in the magnetic free stacked layer 216 can be determined. Besides, since the magnetization direction of the stacked magnetic pinned layer 210 is perpendicular to the magnetization direction of the magnetic free stacked layer 216 in natural status, any other memory cell not supplied with magnetic field is in intermediate status can be selected as reference memory cell.

Figure 9:
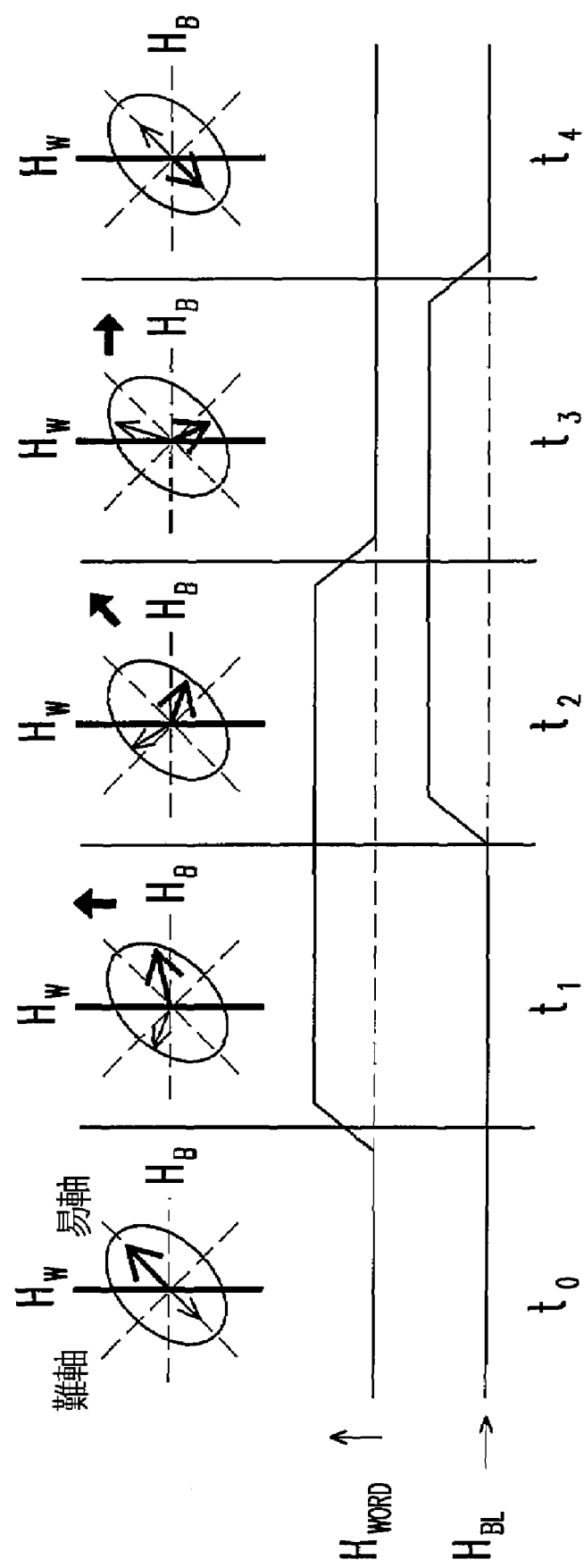
FIG. 9 schematically illustrates the switching mechanism according to the present invention.

Below, how to rotate the directions of magnetization vectors 214 and 212 in the top free layer 204 and bottom free layer 200 of the magnetic free stacked layer 216 will be described. FIG. 9 schematically illustrates the switching mechanism according to the present invention. Referring to FIG. 9, the magnetic field waveform below is produced by the corresponding word current line and bit current line, which basically can be divided into 5 time sections t0~t4. The magnetic field Hword ($H_W$) produced by the word current line is, as denoted by the arrow in FIG. 9, upward. In addition, the direction of the easy axis is defined as 0°, and then the direction of $H_W$ is in +45°. The magnetic field $H_{BL}$ ($H_B$) produced by bit current line is in −45°, for example, rightward as denoted by the arrow in FIG. 9. In section t0, there is no external magnetic field supplied. Thus, the two magnetization vectors of the magnetic free stacked layer 216 are on the easy axis, for example, the magnetization vector of the bottom free layer is denoted by the bold arrow and the direction thereof is 0°, and the magnetization vector of the top free layer is denoted by the thin arrow and the direction thereof is 180°.

In section t1, magnetic field of $H_W$ is supplied. Here there is an angle between two magnetization vectors, and the two magnetization vectors form an angle of approximately 90° with the external magnetic field since the two magnetization vectors of the magnetic free stacked layer 216 have to be balanced with $H_W$. In section t2, magnetic field $H_B$ is supplied next, which is combined together with the magnetic field $H_W$ to produce a magnetic field having a total vector at an angle of about 0°. Thus, the two magnetization vectors are rotated clockwise. The magnetic field $H_W$ is turned off in section t3 so that only the magnetic field $H_B$ is left. Here the direction of the external magnetic field is at −45°, namely, rightward. Here the two magnetization vectors are rotated again.

It should be noted that, in section t3, the magnetization vector denoted by the thin arrow is closer to easy axis 0°, while the magnetization vector denoted by the bold arrow is closer to easy axis 180°. In section t4, the magnetic field $H_B$ is further turned off, and here it is the natural status. The two magnetization vectors go back to the closest easy axis since there is no external magnetic field supplied, thus, the magnetization vector denoted by thin arrow is on 0° and the magnetization vector denoted by bold arrow is on 180°. Compared to the status in section t0, the status of section t4 has been rotated 180°, namely, reversed. The method illustrated in FIG. 9 is the switching operation.

Moreover, it should be noted that besides the magnetic field pulse in FIG. 9, the operation of rotating 90° in two stages can be accomplished in other ways. For example, the pulse waveforms of magnetic fields $H_B$ and $H_W$ can be exchanged so that the rotation is from −45° to +45° counterclockwise, which results in reverse too. In addition, if the timing of the pulse waveform of the magnetic field $H_B$ is the same as that of the magnetic field $H_W$ but negative direction current is used for producing negative direction pulse, then it is rotated 90° from 225° to 135° clockwise, which has the same reverse result. When the directions of the magnetization vectors 212 and 214 of the magnetic free stacked layer 216 are reversed, the binary data stored in the memory cell is changed, for example "0" is changed into "1". If the directions of the magnetization vectors 212 and 214 of the magnetic free stacked layer 216 are reversed again, the binary data stored is changed from "1" back to the original data "0".

Figure 10A:
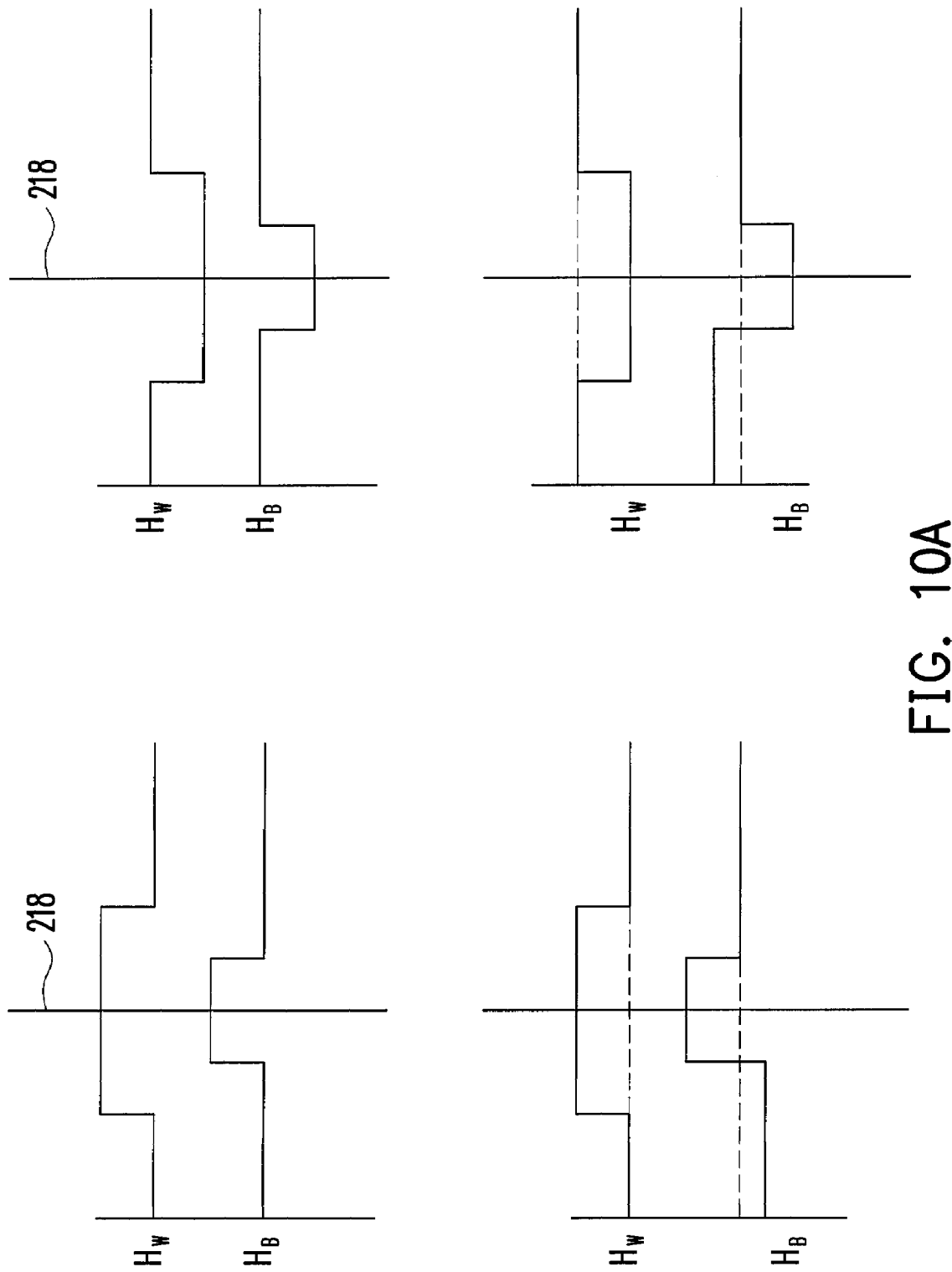
FIG. 10A schematically illustrates the applied waveform of reading operation.

If the data stored in the magnetic free stacked layer 216 is to be read, the magnetic free stacked layer 216 can be rotated in the way as shown in FIG. 9 according to the predetermined direction, so that the magnetoresistances of the magnetic free stacked layer 216 and the stacked magnetic pinned layer 210 are read and compared with a reference magnetoresistance so as to obtain the stored data. However, the reading operation should not change the directions of the magnetization vectors of the magnetic free stacked layer 216, thus, the directions of the magnetization vectors have to be resumed in reverse sequence, thus, the process is different from that in FIG. 9 in the second half. FIG. 10A illustrates the applied waveform of reading operation. In FIG. 10A, the top left figure is the timing diagram of positive magnetic field pulse. The reading time line 218 represents the reading time section, namely, section t2 in FIG. 9. However, since the reading operation won't change the directions of the magnetization vectors of the magnetic free stacked layer 216, the magnetic $H_B$ is turned off first while the magnetic field $H_W$ is turned off next. Accordingly, the magnetization vectors go back to their original directions. Besides, the bottom left figure is the improved magnetic field waveform corresponding to the top left figure, for example, the magnetic field $H_B$ supplies a negative direction magnetic field first, so that errors in data being reversed during reading the data can be reduced effectively, and the mechanism thereof will be described in detail below.

Similar to the situation in FIG. 9, the waveforms and timings of the magnetic fields $H_B$ and $H_W$ in FIG. 10A are not the only choice. Besides exchanging the waveforms of the magnetic fields $H_B$ and $H_W$, waveforms of the magnetic fields $H_B$ and $H_W$ in negative direction may also be used as shown in the top right and bottom right figures. All these changes produce the same results.

In other words, the starting direction of the magnetic field can be in 45°, 135°, 225°, or 315° (i.e. −45°), and then any rotation of 90° crossing the easy axis will have the same rotation result.

Figure 10B:
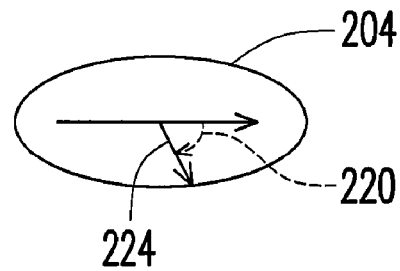
FIG. 10B schematically illustrates the recording mechanism of a magnetic memory cell according to an embodiment of the present invention.
Figure 10B:
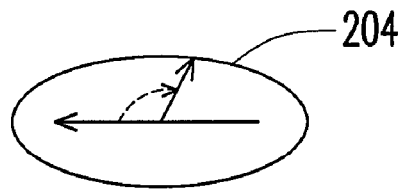
Figure 10B:
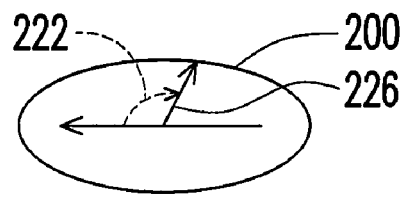
Figure 10B:
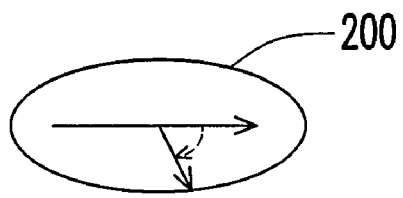
Figure 10B:
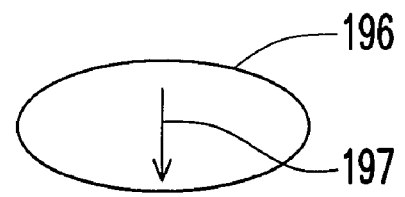
Figure 10B:
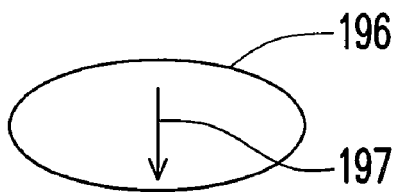
Figure 10B:
Figure 10B:
Figure 10B:
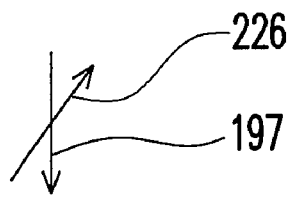
Figure 10B:
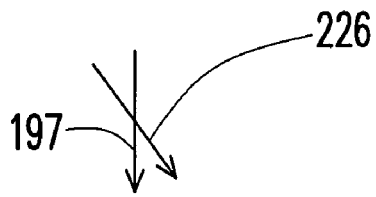

FIG. 10B schematically illustrates the recording mechanism of a magnetic memory cell according to an embodiment of the present invention. In FIG. 10B, the left figure represents a binary data, for example, "1", and the right figure represents another binary data, for example, "0". The magnetization vectors of the top free layer 204 and the bottom free layer 200 of the magnetic free stacked layer are as shown by the arrows, which naturally are in anti-parallel. As to the data of "1", the magnetization vector of the bottom free layer 200 is leftward. Here the magnetization vector 197 of the top pinned layer 196 of the stacked magnetic pinned layer is perpendicular to the magnetization vector of the bottom free layer 200. The direction of the magnetization vector of the top pinned layer 196 is fixed and is not affected by the magnetic field. Through the rotation at time line 218 as shown in FIG. 10A, the magnetization vector of the top free layer 204 is rotated by an angle 220 so as to become the magnetization vector 224. Meanwhile, the magnetization vector of the bottom free layer 200 is rotated by an angle 222 so as to become the magnetization vector 226. Moreover, the reference memory cell is not supplied with the assisted magnetic field as shown in FIG. 10A, the magnetization vector 228 of the bottom free layer 200 thereof remains perpendicular to the magnetization vector 197 (rightward or leftward). As to the memory cell selected to be read, the magnetization vector 226 thereof forms an angle of about 180° with the magnetization vector 197. Thus, the magnetoresistance thereof is greater than the magnetoresistance of the reference memory cell in intermediate status.

Contrarily, as to the data of "0", the rotated magnetization vector 226 forms an angle of about 0° with the magnetization vector 197. Thus, the magnetoresistance thereof is smaller than the magnetoresistance of the reference memory cell in intermediate status. Accordingly, the data of "0" or "1" can be distinguished.

Figure 11:
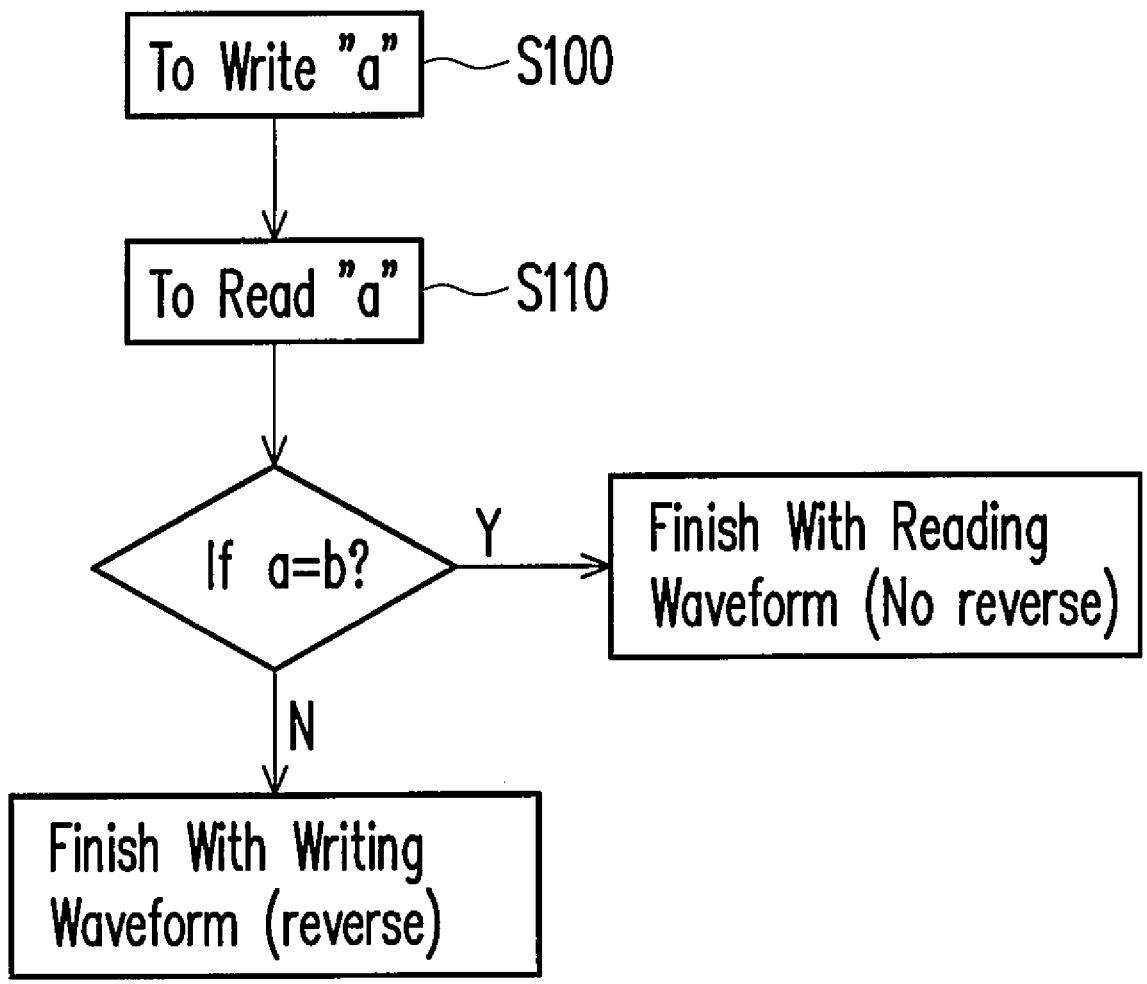
FIG. 11 schematically illustrates the writing flow of a magnetic memory cell according to the present invention.

As to the access of magnetic memory cell, the first halves of the reading operation and the writing operation are the same, and the two operations are different after the presently stored data has been read from the selected memory cell. The reading operation has to resume the magnetization vector to its original status. FIG. 11 schematically illustrates the writing flow of a magnetic memory cell according to the present invention. In step S100, the binary data "a" is determined to be written. In step S110, the presently stored data "b" is read according to the first half of the reading operation, wherein steps S100 and S110 can be executed simultaneously or in reverse sequence. Then, whether "a" is equal to "b" is determined. If a=b, the process is finished with the reading waveform (as shown in FIG. 10A) and the magnetization vector thereof is not reversed. Otherwise if a≠b, the process is finished with the writing waveform (as shown in FIG. 9) and the magnetization vector thereof is reversed.

Figure 12A:
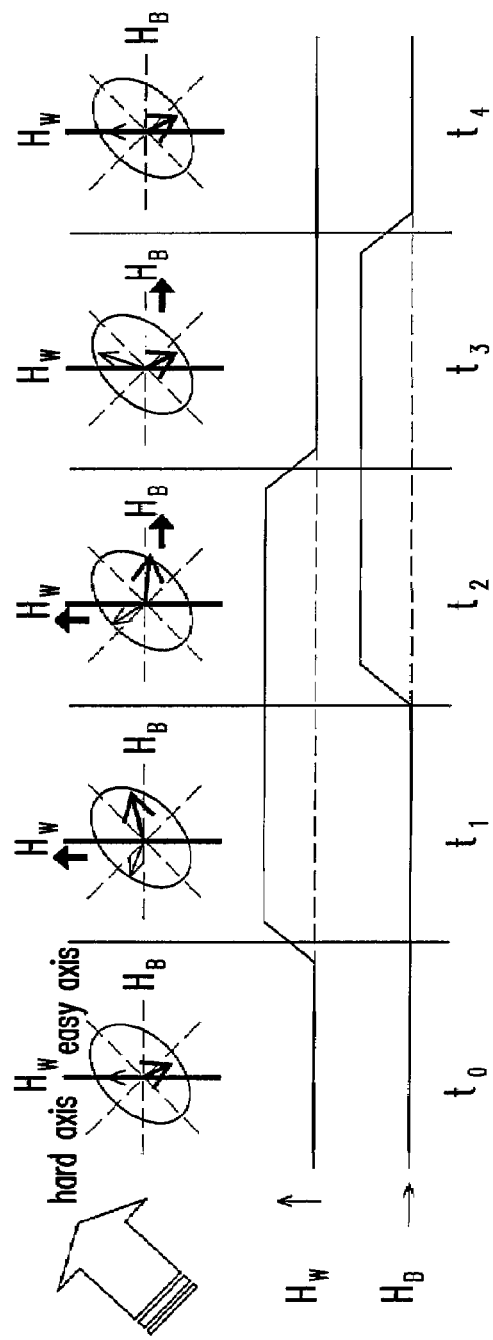
FIG. 12A schematically illustrates the possible situations of failed writing operations according to the research of the present invention.

Generally speaking, the magnetization vector is approximately along the direction of the easy axis of the magnetic material in natural status. However, some factors during fabrication may cause the magnetization vector to be not on the easy axis of the magnetic material, which may cause errors during the process of data switching. FIG. 12A schematically illustrates a possible situations of failed switching operations according to the research of the present invention. Referring to FIG. 12A, the waveform of the assisted magnetic field is similar to that in FIG. 9. However, the magnetization vector in section t0 is not on the easy axis in natural status but, for example, forms an angle with the easy axis. In section t1, the magnetic field $H_W$ is supplied so that the magnetization vector is rotated counterclockwise. In section t2, the magnetic field $H_B$ is further supplied with the magnetic field $H_W$. For example, the magnetic field $H_W$ is about equal to the magnetic field $H_B$, thus, the total magnetic field produced is on the easy axis and is in the direction of 0°. Here the magnetization vector is continued to be rotated. In section t3, the magnetic field $H_W$ is turned off so that only the magnetic field $H_B$ is left in the direction of −45°, here the magnetization vector is continued to the rotated clockwise. However, since the rotated magnetization vector is close to the original magnetization vector in their directions, when the external magnetic field is turned off in section t4, the magnetization vector goes back to its original direction instead of being reversed. Thus, switching error is caused.

Figure 12B:
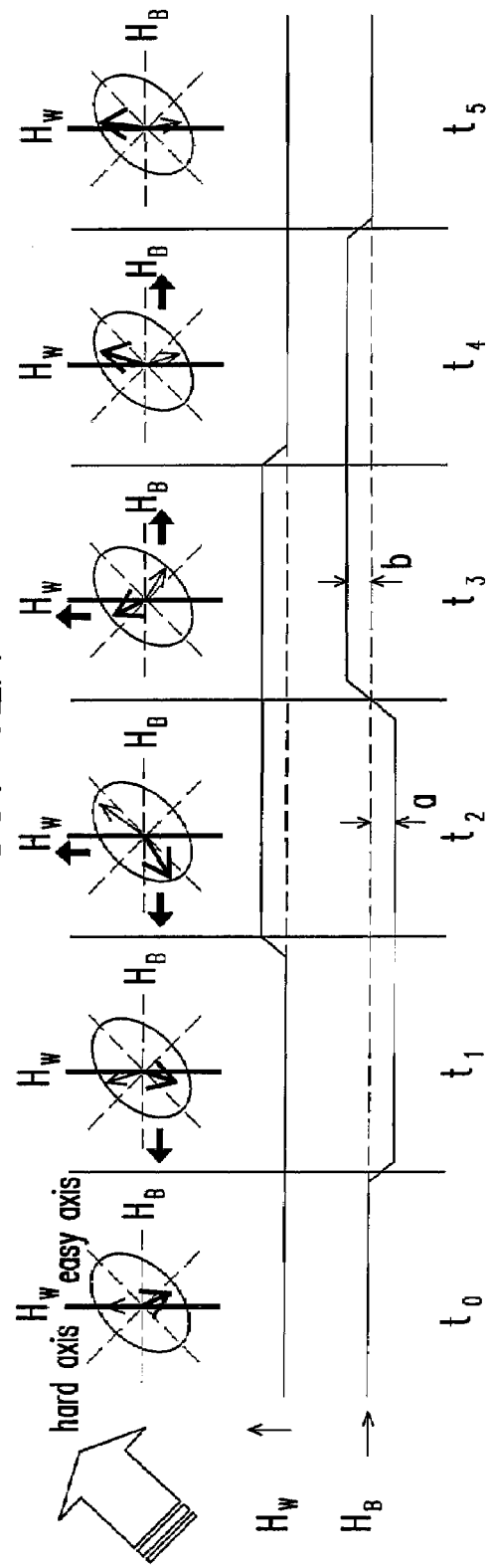
FIG. 12B schematically illustrates another switching waveform according to the present invention.

FIG. 12B schematically illustrates another switching operation and the method for producing auxiliary assisted magnetic field according to the present invention, which can resolve the failed situations in FIG. 12A. Referring to FIG. 12B, to resolve the problem of errors at reversing the magnetization vectors, a negative direction magnetic field $H_B$ is supplied in advance during sections t1 and t2, namely, the period before and after supplying the magnetic field $H_W$. In section t1, first the negative direction magnetic field is supplied in direction of 135° to rotate the magnetization vectors in advance. Next, the magnetization vectors are rotated sequentially as in sections t1~t4 in FIG. 12A based on the previous rotation principle. In section t4, the magnetization vectors have been reversed. In section t5, the status of the magnetization vectors is successfully reversed when the external magnetic field is turned off. Thus, the negative direction magnetic field pulse supplied in advance can effectively reduce data error. Moreover, the height of normal magnetic field pulse is denoted by b in FIG. 12B while the height of the negative direction magnetic field pulse supplied in advance is denoted by a. The height a of the negative direction magnetic field pulse may be, for example, equal to the height b of the magnetic field pulse or a particular height.

Figure 13:
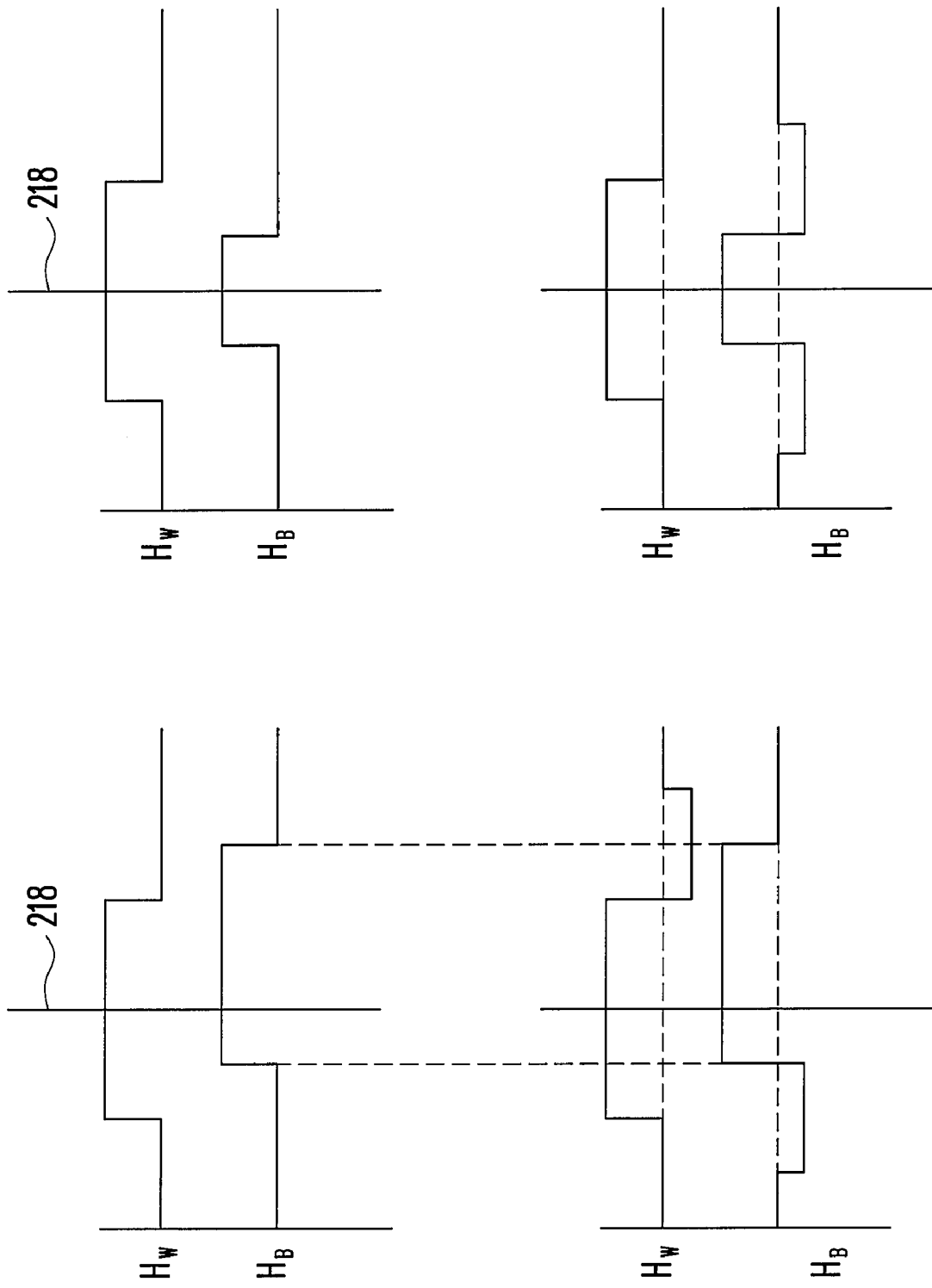
FIG. 13 schematically illustrates the operation of supplying negative direction magnetic field pulse.

Moreover, negative direction magnetic field pulse may also be added during the second half of the operation. FIG. 13 illustrates the operation of supplying negative direction magnetic field pulse. Referring to FIG. 13, the top left diagram is the switching waveform without the negative direction magnetic field pulse added. The top right diagram is the reading waveform or the writing waveform when data is decided not to be reversed, without the negative direction magnetic field pulse added. The bottom left diagram is the switching waveform with the negative direction magnetic field pulse added. The bottom right diagram is the reading waveform or the writing waveform when data is decided not to be reversed, with the negative direction magnetic field pulse added. During the period before and after the starting and ending points of the operation, the negative direction magnetic field pulse can bed added to reduce errors in reading or switching.

Figure 14:
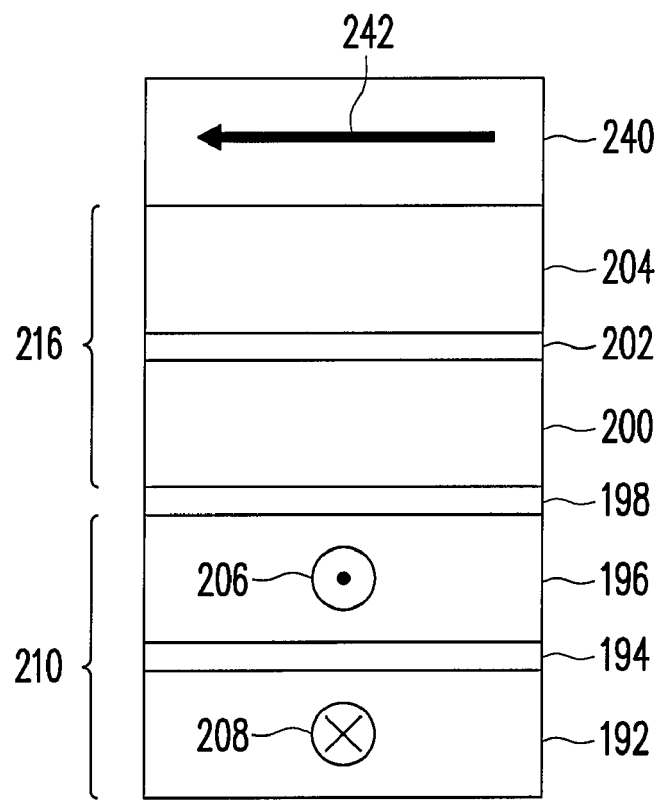
FIG. 14 schematically illustrates the structure of a memory cell according to another embodiment of the present invention.
Figure 14:
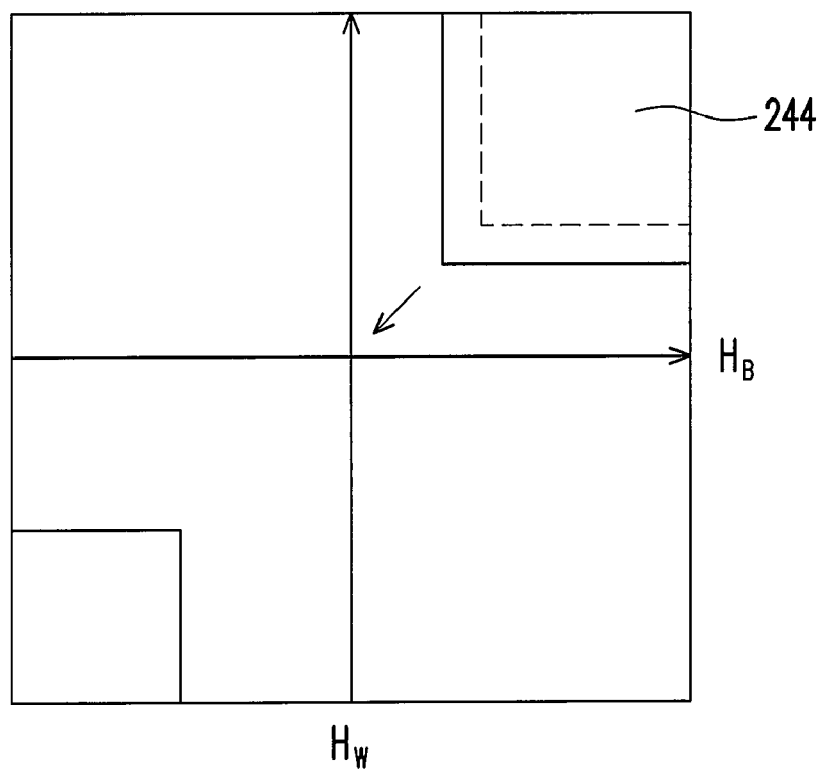

Moreover, the operating region allowed by switching operation has its limitation, and the operating current of the memory cell structure in FIG. 8 may still be too high. Accordingly, in the present invention, a magnetic bias layer is further provided on the memory cell structure, as shown in FIG. 8, to reduce operating current. FIG. 14 schematically illustrates the structure of a memory cell according to another embodiment of the present invention. Referring to FIG. 14, the top part illustrates a memory cell structure which is similar to that in FIG. 8, while the difference is that a magnetic bias layer 240 is further disposed on the top free layer 204 and the magnetic bias layer 240 is on the magnetic free stacked layer 216. There is a magnetic coupling spacer (not shown) between the magnetic bias layer 240 and the top free layer 204. The magnetic bias layer 240 has a magnetization vector 242 which produces a biased magnetic field vector to the magnetic free stacked layer 216. The function of the magnetization vector 242 is as shown in the bottom part of FIG. 14. The switching operation area 244, if there is no magnetic bias layer 240 disposed, is as the dotted line area shown in the figure, which is farer from the magnetic field zero. However, since the magnetic bias layer 240 produces a magnetic field bias, so that the switching operation area 244 shifts towards the magnetic field zero. Accordingly, the required writing magnetic field is smaller compared to the magnetic fields $H_W$ and $H_B$ and so the present device consumes less power.

Besides, the magnetization vector 242 of the magnetic bias layer 240 may be parallel or anti-parallel to the magnetization vector of the top free layer 204. The magnetic bias layer 240 may be a magnetic signal layer or a magnetic stacked layer. A magnetic staked layer may be formed by stacking a non-magnetic metal layer, a ferromagnetic metal layer, and an anti-ferromagnetic metal layer.

Figure 15:
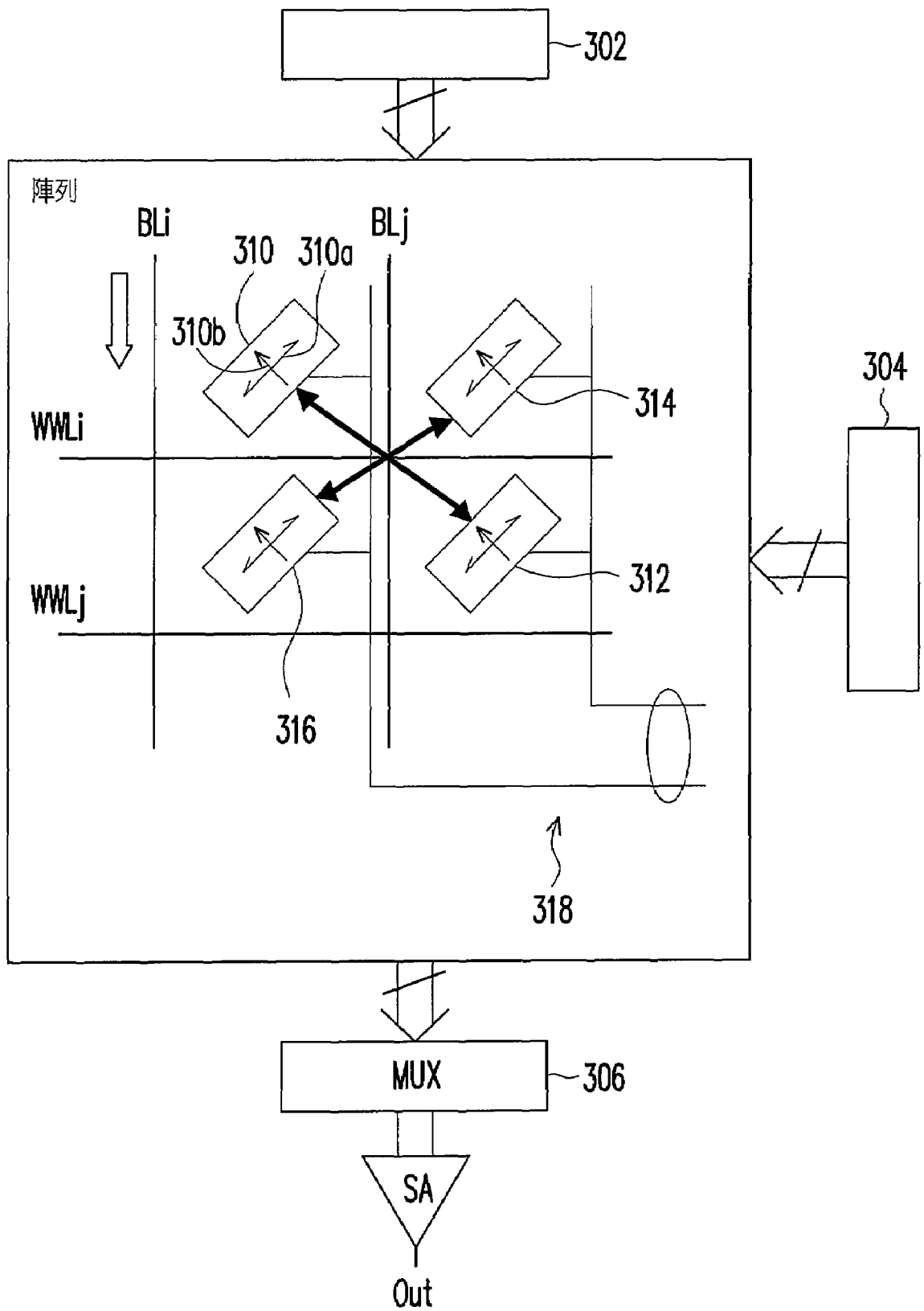
FIG. 15 is a diagram schematically illustrating the circuit of a magnetic memory according to another embodiment of the present invention.

Furthermore, the entire magnetic memory circuit is as illustrated in FIG. 15. FIG. 15 is a diagram schematically illustrating the circuit of a magnetic memory according to another embodiment of the present invention. The magnetic memory circuit includes, for example, a plurality of foregoing magnetic memory cell structures 310-316 for forming an array having a plurality of memory columns and a plurality of memory rows. Using the magnetic memory cell structure 310 as example, double-arrow 310a represents two possible directions of the magnetization vector of the free layer, while single-arrow 310b represents the direction of the magnetization vector of the pinned layer. In natural status, the direction of the magnetization vector of the free layer is actually perpendicular to the direction of the magnetization vector of the pinned layer. Moreover, bit current lines BLi and BLj are respectively disposed corresponding to a plurality of memory columns, word current lines WWLi and WWLj are respectively disposed corresponding to a plurality of memory rows, and each of the read bit lines (also referred to as sense lines) 318 can respectively read a magnetoresistance of each of the memory cell structures. A driving circuit unit, which includes, for example, bit line driving unit 302 and word line driving unit 304, controls the bit and the word current lines, the bit/word current lines and the read bit lines, so as to supply a plurality of assisted magnetic fields required for access to the selected memory cell structure and to read a magnetoresistance.

It should be noted that in the present invention, one of the memory cell structures which are not supplied with magnetic fields is serving as a reference memory cell, and a reference magnetoresistance of the reference memory cell is read. For example, memory cell 310 experiences the auxiliary operating waveform as in FIG. 10A or the right diagrams of FIG. 13 when memory cell 310 is selected, while memory cell 312 does not experience the magnetic field and so can serve as the reference memory cell. Since naturally all the memory cells in the present invention are in intermediate status of magnetoresistance, all the memory cells can be used as reference memory cells. For convenience, it can be set as, for example, always selecting the diagonal memory cell as the reference memory cell. When the magnetoresistance of the memory cell is obtained through the read bit lines 318, the magnetoresistance of the selected memory cell and the magnetoresistance of the reference memory cell are output through the selection of the multiplexer 306 (MUX), and which are detected by a sense amplifier (SA) so as to obtain the binary logic data of the memory cell. During writing operation, if the magnetization vector needs to be reversed after the binary data is judged, the driving circuit units 304 and 302 finish with switching waveform. The circuit design can be different based on the foregoing principle and therefore will not be described herein.

Naturally the memory cells in the present invention are all in the intermediate status of the magnetoresistance, thus, the reference memory cell dose not have to be a common unit, so that the load of the reference memory cell can be distracted.

Figure 16:
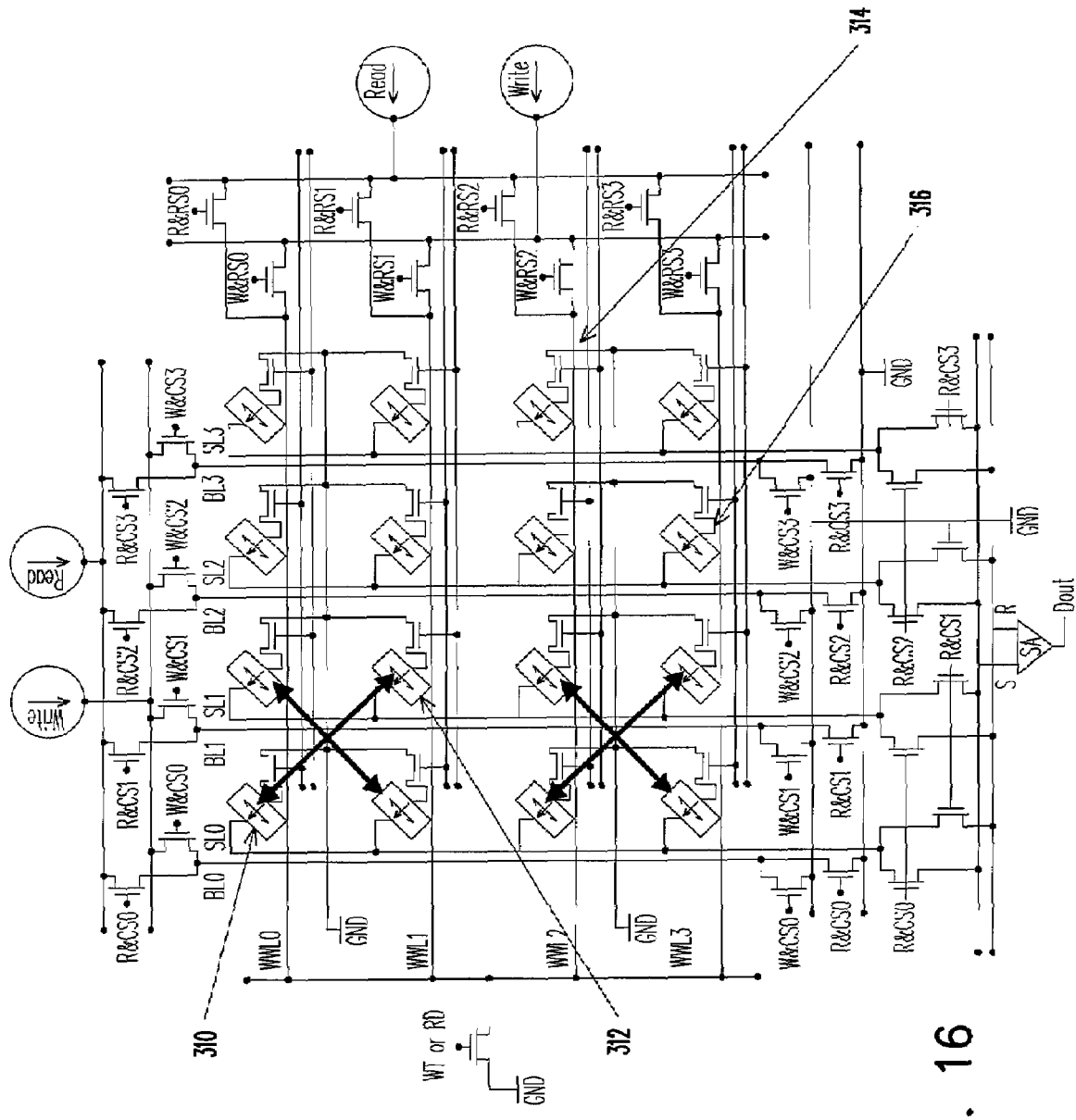
FIG. 16 is a diagram schematically illustrating the circuit of a magnetic memory according to another embodiment of the present invention.

FIG. 16 is a diagram illustrating the circuit schematic of a magnetic memory according to another embodiment of the present invention. In FIG. 16, the magnetic memory circuit includes some basic circuits, the memory cell to be accessed can be selected through bit current lines BL0, BL1 . . . and word current lines WWL0, WWL1 . . . , so that magnetic field can be supplied. In addition, the magnetoresistances of the selected memory cell and the reference memory cell are read through the sense lines SL0, SL1 . . . , and finally the stored binary data is determined by the sense amplifier SA. The actual circuit may have different variations and should be understood by those having ordinary skill in the art.

It should be noted here that all the memory cells in the present invention are in the intermediate status of the magnetoresistance, thus the reference memory cell does not have to be shared, so that the load of the reference memory cell can be distracted. For example, one of the diagonal memory cells 310 and 312 can be used as the reference memory cell of the other. When the memory cell 310 is to be accessed, the memory cell 312 is used as the reference memory cell. Contrarily, when the memory cell 312 is to be accessed, the memory cell 310 is serving as the reference memory cell. Moreover, the bold double-arrow represents the possible preferable combination of the two diagonal memory cells 310 and 312. In other words, FIG. 16 shows one example of exemplary arrangements, wherein four memory cells are included in one group.

Figure 17:
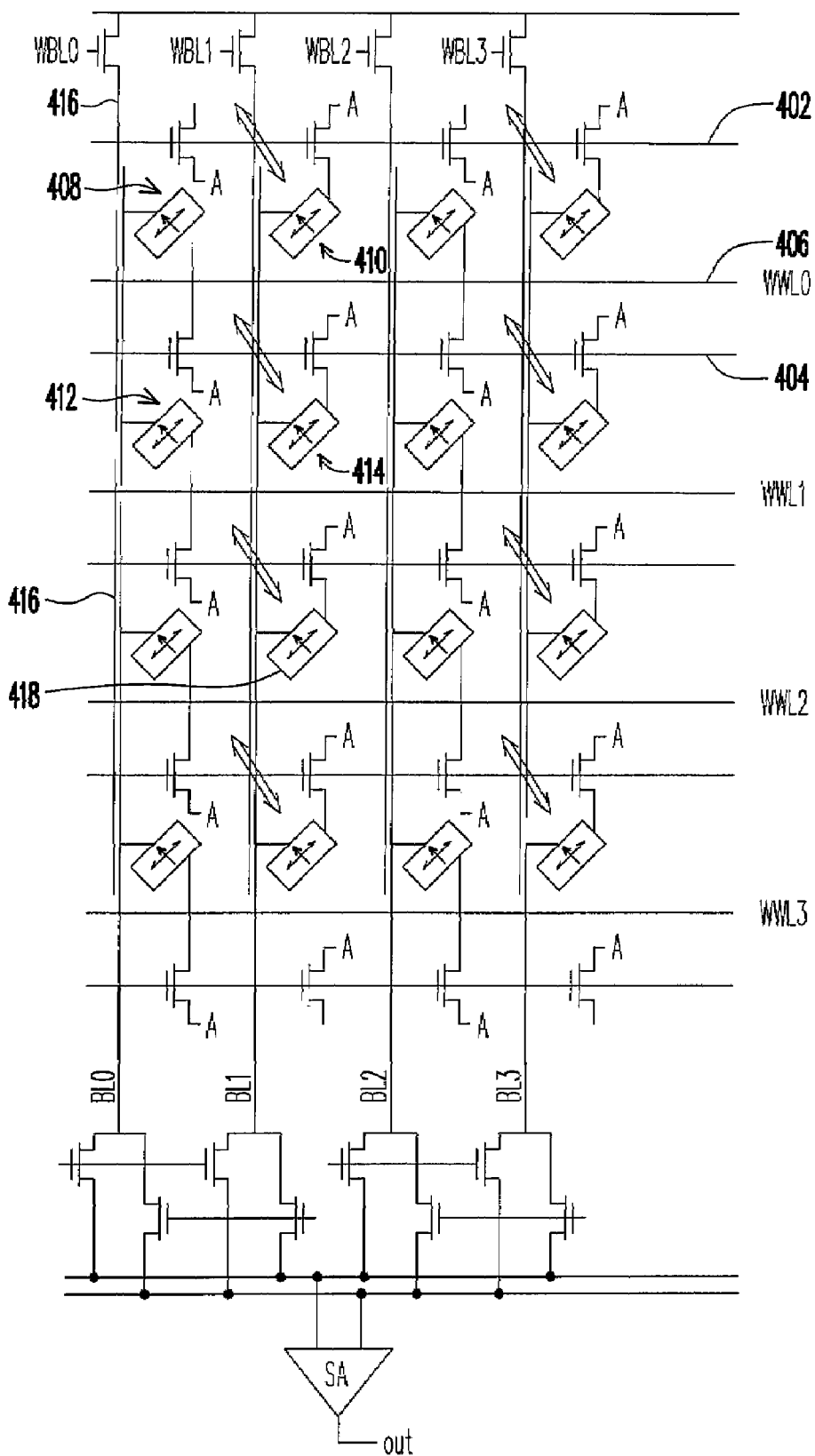
FIG. 17 is a diagram schematically illustrating the circuit of a magnetic memory according to another embodiment of the present invention.

FIG. 17 is a diagram schematically illustrating the circuit schematic of a magnetic memory according to another embodiment of the present invention. In FIG. 17, the driving principle is the same as that in FIG. 16, however, the selection of reference memory cell can be, for example, always selecting memory cell in the same direction. For example, the reference memory cell of the memory cell 408 can always be memory cell 414. In addition, the reference memory cell of the memory cell 412 may always be, for example, memory cell 418. Furthermore, as to memory cells of the outmost memory row 410, a reference memory row (not shown in FIG. 17) can be disposed additionally at the peripheral region of the memory cell array. Thus, in the circuit arrangement, it can be only one read word line 402 or 404 passing through each memory cell. The read word line 402 can be used for controlling the on/off of the transistors. The auxiliary assisted magnetic field required additionally can be provided by the current lines 406 and 416. The data can be read through the bit signal lines BL0, BL1 . . . , and the binary data can be determined by the sense amplifier SA. According to the present embodiment, two adjacent bit signal lines BL0 and BL1 are arranged into one group.

The circuit design can be changed according to the actual requirement. What should be noted is the selection of the reference memory cell. There may be corresponding changes to the driving circuit due to different selections of reference memory cell. These changes should be understood by those having ordinary skill in the art and therefore will not be described herein.

As to a conventional memory cell structure, the magnetization vector of the free layer thereof is parallel or anti-parallel to the magnetization vector of the pinned layer thereof in natural status. Thus, conventionally a common reference memory cell has to be disposed additionally, thus, the load of the conventional reference memory cell is heavy, which may result in damage.

According to arrangement of reference memory cell in the present invention, naturally the memory cell structures in the present invention are all in the intermediate status of magnetoresistance, thus the adjacent memory cell can be selected as the reference memory cell. In other words, the memory cell itself can serve as the reference memory cell, so that the load of all memory cells can be distracted.

Figure 18:
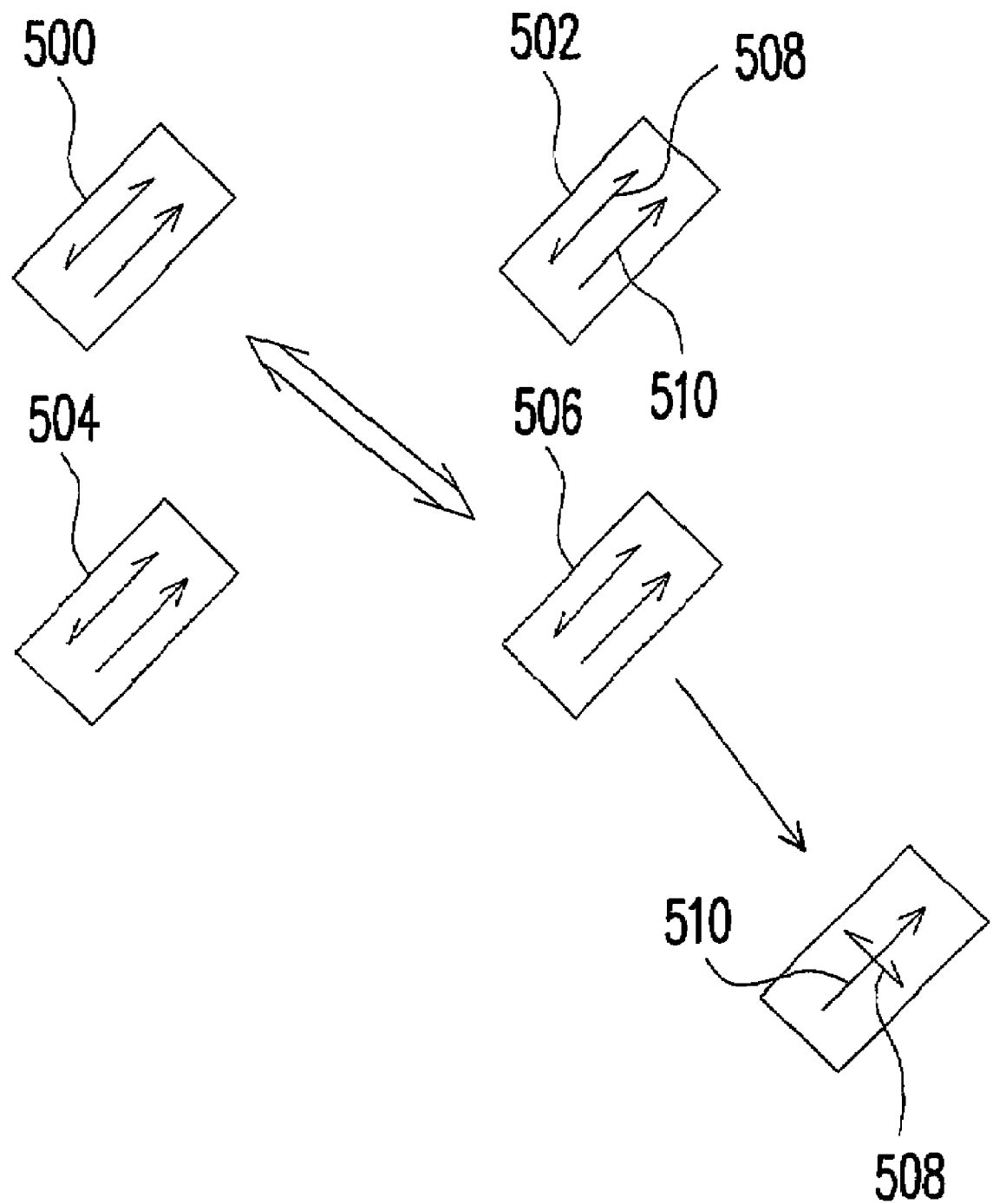
FIG. 18 schematically illustrates the driving method of another reading mechanism according to the present invention.

Moreover, the present invention also provides a resolution regarding the conventional memory cell structure based on the reference memory cell selection principle of the present invention. FIG. 18 illustrates the driving method of another reading mechanism according to the present invention. Referring to FIG. 18, the selection of the reference memory cell may also be, for example, selecting the diagonal memory cell or other memory cell in natural status as the reference memory cell. However, the driving method has to be passive. In FIG. 18, double-arrow 508 represents the two possible directions of the magnetization vector of the free layer, and the single-arrow 510 represents the direction of the magnetization vector of the pinned layer. As to the conventional memory cell structure, naturally the magnetization vector 508 of the free layer is parallel or anti-parallel to the magnetization vector 510 of the pinned layer. According to the present invention, under the arrangement of the memory cell 500 and the memory cell 506 being the reference memory cell to one another, when the data in the memory cell 500 is to be read, the magnetization vector 508 of the free layer of the reference memory cell 506 is rotated by 90° to be in the status as shown in the bottom right diagram, which is the intermediate status of the magnetoresistance. Thus, the binary data of the memory cell 500 can still be obtained after comparing the memory cell 500 and the reference memory cell 506. Accordingly, in the passive reading mode, the magnetization vector of the free layer of the reference memory cell 506 is rotated but not that of the selected memory cell 500. A pair of memory cells 502 and 504 in another direction can be read by using the same method. The binary data of the memory cell is changed if the switching waveform is supplied only when the data of the memory cell needs to be changed.

The memory cell structures in the present invention are naturally in the intermediate status of magnetoresistance, thus the reference memory cell can be selected freely. In another embodiment, the memory cell structures can be in the intermediate status of magnetoresistance with auxiliary operating waveform supplied. In other words, the memory cell itself can serve as the reference memory cell, so that the load of all memory cells can be distracted.

The present invention further provides a passive driving method, wherein the reference memory cell can be selected freely and the magnetization vector of the free layer of the reference memory cell is rotated to obtain the reference magnetoresistance, which is compared with the magnetoresistance of the selected memory cell structure to obtain the binary data.

According to the present invention, the negative direction magnetic field pulse is employed for improving the accuracy of data access. Furthermore, the operation current is reduced by supplying magnetic bias to the free layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic memory cell structure, comprising:
   a stacked magnetic pinned layer, comprising a top pinned layer and a bottom pinned layer, there being a sufficient large magnetic coupling force between the top pinned layer and the bottom pinned layer for maintaining a magnetization vector of the top pinned layer in a reference direction;
   a tunnel barrier layer, disposed on the stacked magnetic pinned layer; and
   a magnetic free stacked layer, disposed on the tunnel barrier layer, wherein the magnetic free stacked layer comprises a bottom free layer having a bottom magnetization vector and a top free layer having a top magnetization vector,
   wherein if no assisted magnetic field is supplied, the bottom magnetization vector is anti-parallel to the top magnetization vector and is perpendicular to the reference direction of the top pinned layer.

2. The magnetic memory cell structure as claimed in claim 1 further comprising a magnetic bias layer disposed on the magnetic free stacked layer, wherein the magnetic bias layer produces a biased magnetic field vector to the magnetic free stacked layer for shifting a writing area to a magnetic field zero.

3. The magnetic memory cell structure as claimed in claim 2, wherein the biased magnetic field vector is parallel or anti-parallel to the top magnetization vector of the top free layer.

4. The magnetic memory cell structure as claimed in claim 2, wherein the magnetic bias layer is a magnetic single layer.

5. The magnetic memory cell structure as claimed in claim 2, wherein the magnetic bias layer has a magnetization vector to produce the biased magnetic field vector.

6. The magnetic memory cell structure as claimed in claim 1, wherein the top free layer and the bottom free layer of the magnetic free stacked layer comprise ferromagnetic metal material and are separated by a magnetic coupling spacer.

7. A data access method, suitable for a magnetic memory cell of a magnetic memory device, wherein the magnetic memory device comprises the magnetic memory cell structure as claimed in claim 1, a word current line, and a bit current line, wherein the direction of an easy axis of the magnetic free stacked layer is defined as 0°, the data access method comprising:

a first reading stage, comprising:
   supplying a first assisted magnetic field in a first direction to the magnetic memory cell;
   supplying a second assisted magnetic field in a second direction to the magnetic memory cell, wherein a total magnetic field direction of the first and the second directions is on the easy axis, wherein the actions of the first and the second directions change the direction of the bottom magnetization vector of the magnetic free stacked layer to be parallel or anti-parallel to the direction of the magnetization vector of the top pinned layer; and
   reading a magnetoresistance of the magnetic memory cell, obtaining a binary data presently stored after comparing the magnetoresistance and a reference magnetoresistance;
a second reading stage, comprising turning off the second assisted magnetic field; and
a third reading stage, turning off the first assisted magnetic field.

8. The data access method as claimed in claim 7, wherein the first reading stage further comprises supplying a predetermined negative direction magnetic field which is in opposite direction to the second assisted magnetic field before supplying the second assisted magnetic field and during the period before supplying the first assisted magnetic field.

9. The data access method as claimed in claim 8, wherein the second and the third reading stages further comprise supplying another successive negative direction magnetic field which is in opposite direction to the second assisted magnetic field after turning off the second assisted magnetic field and during the period after turning off the first assisted magnetic field.

10. The data access method as claimed in claim 7, wherein the second and the third reading stages further comprise supplying a successive negative direction magnetic field which is in opposite direction to the second assisted magnetic field after turning off the second assisted magnetic field and during the period after turning off the first assisted magnetic field.

11. The data access method as claimed in claim 7 further comprising:
   a first writing stage, executing the same steps as in the first reading stage, wherein the process is finished after executing the second and the third reading stages if the binary data is the same as a data to be written;
   a second writing stage, turning off the first assisted magnetic field if the binary data being different from a data to be written; and
   a third writing stage, turning off the second assisted magnetic field if the binary data being different from a data to be written.

12. The data access method as claimed in claim 11, wherein the first writing stage further comprises supplying a predetermined negative direction magnetic field which is in opposite direction to the second assisted magnetic field before supplying the second assisted magnetic field and during the period before supplying the first assisted magnetic field.

13. The data access method as claimed in claim 12, wherein the second and the third writing stages further comprise supplying another successive negative direction magnetic field which is in opposite direction to the first assisted magnetic field after turning off the first assisted magnetic field and during the period after turning off the second assisted magnetic field.

14. The data access method as claimed in claim 11, wherein the second and the third writing stages further comprise supplying a successive negative direction magnetic field which is in opposite direction to the first assisted magnetic field after turning off the first assisted magnetic field and during the period after turning off the second assisted magnetic field.

15. The data access method as claimed in claim 11, wherein during the third writing stage, the magnetization vector of the magnetic free stacked layer is rotated 180°.

16. The data access method as claimed in claim 7, wherein during the first reading stage, the first direction of the first assisted magnetic field is substantially in 90° to the second direction of the second assisted magnetic field.

17. The data access method as claimed in claim 16, wherein during the first reading stage, the first direction is substantially at 45°, 135°, 225°, or 315° to the easy axis.

18. A magnetic memory circuit, comprising:
a plurality of magnetic memory cell structures as claimed in claim 1, forming a memory cell array having a plurality of memory columns and a plurality of memory rows;
a plurality of bit current lines, disposed respectively corresponding to the memory columns;
a plurality of word current lines, disposed respectively corresponding to the memory rows;
a plurality of read bit lines, each of the read bit lines respectively reading a magnetoresistance of each of the memory cell structures;
a driving circuit unit, controlling the word current lines, the bit current lines, and the read bit lines, so as to supply a plurality of assisted magnetic fields required for data access to the selected memory cell structure and to read the magnetoresistance of the selected memory cell structure, wherein one of the memory cell structures not being supplied with magnetic fields is serving as a reference memory cell, and a reference magnetoresistance of the reference memory cell is read; and
a comparison circuit unit, receiving the magnetoresistance and comparing the received magnetoresistance with the reference magnetoresistance to determine a binary data stored in the selected memory cell.

19. The magnetic memory circuit as claimed in claim 18, wherein a reference memory row is further disposed at one side of the memory rows so that the outmost memory row can be compared with the reference memory row.

20. The magnetic memory circuit as claimed in claim 18, wherein the direction of an easy axis of the magnetic free stacked layer is defined as 0°, a positive direction current passing through the word current lines produces a magnetic field in the direction of +45°, a positive direction current passing through the bit current lines produces a magnetic field in the direction of −45°, wherein a data access to the selected memory cell structure in the magnetic memory circuit comprises:
a first reading stage, comprising:
supplying a first assisted magnetic field to the magnetic memory cell, the first assisted magnetic field being substantially in a first direction at 45°, 135°, 225°, or 315° to the easy axis;
supplying a second assisted magnetic field to the magnetic memory cell, wherein a second direction of the second assisted magnetic field is substantially at 90° to the first direction, so that a total magnetic field direction is substantially on the easy axis; and
reading a magnetoresistance of the magnetic memory cell, a presently stored binary data could be obtained after comparing the magnetoresistance and a reference magnetoresistance;
a second reading stage, comprising turning off the second assisted magnetic field; and
a third reading stage, turning off the first assisted magnetic field.

21. The magnetic memory circuit as claimed in claim 20, wherein the first reading stage further comprises supplying a predetermined negative direction magnetic field which is in opposite direction to the second assisted magnetic field before supplying the second assisted magnetic field and during the period before supplying the first assisted magnetic field.

22. The magnetic memory circuit as claimed in claim 20, wherein the second and the third reading stages further comprise supplying a successive negative direction magnetic field which is in opposite direction to the second assisted magnetic field after turning off the second assisted magnetic field and during the period after turning off the first assisted magnetic field.

23. The magnetic memory circuit as claimed in claim 20 further comprising:
a first writing stage, executing the same steps as in the first reading stage, wherein the process is finished after executing the second and the third reading stages if the binary data is the same as a data to be written;
a second writing stage, turning off the first assisted magnetic field if the binary data is different from a data to be written; and
a third writing stage, turning off the second assisted magnetic field if the binary data is different from a data to be written.

24. The magnetic memory circuit as claimed in claim 23, wherein the first writing stage further comprises supplying a predetermined negative direction magnetic field which is in opposite direction to the second assisted magnetic field before supplying the second assisted magnetic field and during the period before supplying the first assisted magnetic field.

25. The magnetic memory circuit as claimed in claim 23, wherein the second and the third writing stages further comprise supplying a successive negative direction magnetic field which is in opposite direction to the first assisted magnetic field after turning off the first assisted magnetic field and during the period after turning off the second assisted magnetic field.

26. The magnetic memory circuit as claimed in claim 18, wherein the reference memory cell and the selected memory cell structure are in adjacent diagonal relationship.

27. A magnetic memory circuit, comprising:
a plurality of memory cell structures, forming a memory cell array having a plurality of memory columns and a plurality of memory rows;
a plurality of bit current lines, disposed respectively corresponding to the memory columns;

a plurality of word current lines, disposed respectively corresponding to the memory rows;

a plurality of read bit lines, each of the read bit lines reading a magnetoresistance of each of the memory cell structures;

a driving circuit unit, controlling the word current lines, the bit current lines, and the read bit lines to directly read the magnetoresistance of the selected memory cell structure, to supply a plurality of assisted magnetic fields required for data access to a reference memory cell structure and to read a reference magnetoresistance, wherein one of the memory cell structures different from the selected memory cell structure serves as the reference memory cell structure; and a comparison circuit unit, receiving the magnetoresistance and comparing the received magnetoresistance with the reference magnetoresistance to determine a binary data stored in the selected memory cell structures, wherein during a writing operation, the binary data read by the comparison circuit unit is kept if the binary data is the same as a data to be written, the direction of a magnetization vector of a magnetic free stacked layer of the selected memory cell structure is reversed by the driving circuit unit if the binary data is different from the data to be written.

28. The magnetic memory circuit as claimed in claim 27, wherein the reference memory cell and the selected memory cell structure are in adjacent diagonal relationship.

* * * * *